(12) United States Patent
Yang et al.

(10) Patent No.: US 10,904,061 B2
(45) Date of Patent: Jan. 26, 2021

(54) SIGNAL PHASE ROTATION

(71) Applicant: QUALCOMM Incorporated, San Diego, CA (US)

(72) Inventors: Lin Yang, San Diego, CA (US); Jialing Li Chen, San Diego, CA (US); Bin Tian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/744,543

(22) Filed: Jan. 16, 2020

(65) Prior Publication Data
US 2020/0228380 A1 Jul. 16, 2020

Related U.S. Application Data

(60) Provisional application No. 62/793,372, filed on Jan. 16, 2019.

(51) Int. Cl.
*H04L 27/26* (2006.01)
*H04L 25/03* (2006.01)
*H04L 5/00* (2006.01)
*H03L 7/091* (2006.01)
*H04B 7/08* (2006.01)

(52) U.S. Cl.
CPC .......... *H04L 27/2657* (2013.01); *H03L 7/091* (2013.01); *H04B 7/084* (2013.01); *H04L 5/0039* (2013.01); *H04L 25/03885* (2013.01)

(58) Field of Classification Search
CPC .............. H04L 27/2657; H04L 5/0039; H04L 25/03885; H03L 7/091; H04B 7/084
See application file for complete search history.

(56) References Cited

U.S. PATENT DOCUMENTS

| 8,412,275 | B2* | 4/2013 | Kim | H04B 7/0417 370/252 |
| 2011/0228878 | A1* | 9/2011 | Sorrentino | H04L 5/0007 375/295 |
| 2017/0201403 | A1* | 7/2017 | Johansson | H04B 7/0639 |
| 2019/0268805 | A1* | 8/2019 | Lee | H04L 25/0226 |

* cited by examiner

*Primary Examiner* — Freshteh N Aghdam
(74) *Attorney, Agent, or Firm* — Kevin M. Donnelly; Paradice and Li LLP

(57) ABSTRACT

This disclosure provides methods, devices, and systems for a wireless communication device to perform signal phase rotation. In some implementations, the wireless communication device may determine a number of phase rotation parameters to be applied to a number of tones of a transmission signal. In some aspects, each of the phase rotation parameters indicates a phase rotation to be applied to each of the tones according to a carrier index range for each of the tones and a bandwidth mode for the transmission signal. In some implementations, the wireless communication device may apply the phase rotation parameters to respective ones of the tones according to the specified phase rotations and the carrier index ranges, and transmit the transmission signal from the wireless communication device according to the applied phase rotation parameters.

24 Claims, 8 Drawing Sheets

SIGNAL PHASE ROTATION

CROSS-REFERENCE TO RELATED APPLICATIONS

This patent application claims priority to U.S. Provisional Patent Application No. 62/793,372, entitled "PHASE ROTATION FOR LEGACY PREAMBLE IN EHT" and filed on Jan. 16, 2019, which is assigned to the assignee hereof. The disclosures of all prior applications are considered part of and are incorporated by reference in this patent application.

TECHNICAL FIELD

This disclosure relates generally to wireless communications, and more specifically, to defining phase rotation parameters.

DESCRIPTION OF THE RELATED TECHNOLOGY

A wireless local area network (WLAN) may be formed by one or more access points (APs) that provide a shared wireless communication medium for use by a number of client devices also referred to as stations (STAs). The basic building block of a WLAN conforming to the Institute of Electrical and Electronics Engineers (IEEE) 802.11 family of standards is a Basic Service Set (BSS), which is managed by an AP. Each BSS is identified by a Basic Service Set Identifier (BSSID) that is advertised by the AP. An AP periodically broadcasts beacon frames to enable any STAs within wireless range of the AP to establish or maintain a communication link with the WLAN.

An orthogonal frequency-division multiplexing (OFDM) time domain signal is a weighted sum of complex signals in all tones. By applying specific phase rotations to particular tones of a time-domain signal, a transmitting device may reduce the peak-to-average power ratio (PAPR) of the time domain signal, which may enable the transmitting device to use lower power backoff values for its power amplifiers, or may reduce signal distortion caused by its power amplifiers. As the frequency bandwidth upon which wireless communication devices transmit data becomes wider and more non-contiguous, conventional phase rotation schemes may no longer be adequate.

SUMMARY

The systems, methods and devices of this disclosure each have several innovative aspects, no single one of which is solely responsible for the desirable attributes disclosed herein.

One innovative aspect of the subject matter described in this disclosure can be implemented in a method for wireless communication. One innovative aspect of the subject matter described in this disclosure can be implemented in a method for wireless communication. The method may be performed by a wireless communication device, and may include determining, for each tone of a plurality of tones of a signal for transmission, a phase rotation based on a carrier index range for a corresponding tone of the plurality of tones and a bandwidth mode for transmission of the signal, applying the determined phase rotations to respective tones of the plurality of tones, and transmitting the signal based on the phase rotations applied to the plurality of tones of the signal. In some implementations, the phase rotations may be determined without considering preamble puncturing for the transmitted signal. In some other implementations, the phase rotations may be determined without considering front end bandwidths used to transmit the signal. The bandwidth mode may be one of 20 MHz, 40 MHz, 80 MHz, 160 MHz, or 80+80 MHz, and the method may also include applying a selected multiplier value of a plurality of multiplier values to each tone of the plurality of tones that falls within the carrier index range, where each tone of the plurality of tones that falls within the carrier index range is pre-extremely high throughput (pre-EHT) modulated.

Another innovative aspect of the subject matter described in this disclosure can be implemented in a wireless communication device. The wireless communication device may include at least one modem, at least one processor communicatively coupled with the at least one modem, and at least one memory communicatively coupled with the at least one processor and storing processor-readable code. The processor-readable code, when executed by the at least one processor in conjunction with the at least one modem, may be configured to determine, for each tone of a plurality of tones of a signal for transmission, a phase rotation based on a carrier index range associated with the respective tone and a bandwidth mode for transmission of the signal, apply the determined phase rotations to the respective tones of the plurality of tones, and transmit the signal based on the phase rotations applied to the plurality of tones of the signal. In some implementations, the phase rotations may be determined without considering preamble puncturing for the transmitted signal. In some other implementations, the phase rotations may be determined without considering front end bandwidths used to transmit the signal. The bandwidth mode may be one of 20 MHz, 40 MHz, 80 MHz, 160 MHz, or 80+80 MHz, and the method may also include applying a selected multiplier value of a plurality of multiplier values to each tone of the plurality of tones that falls within the carrier index range, where each tone of the plurality of tones that falls within the carrier index range is pre-EHT modulated.

Another innovative aspect of the subject matter described in this disclosure can be implemented in a mobile station. The mobile station may include at least one modem, at least one processor communicatively coupled with the at least one modem, at least one memory communicatively coupled with the at least one processor and storing processor-readable code, at least one transceiver coupled to the at least one modem, at least one antenna coupled to the at least one transceiver to wirelessly transmit signals output from the at least one transceiver and to wirelessly receive signals for input into the at least one transceiver, and a housing that encompasses the at least one modem, the at least one processor, the at least one memory, the at least one transceiver, and at least a portion of the at least one antenna. In some implementations, the processor-readable code, when executed by the at least one processor in conjunction with the at least one modem, may be configured to determine, for each tone of a plurality of tones of a signal for transmission, a phase rotation based on a carrier index range associated with the respective tone and a bandwidth mode for transmission of the signal, to apply the determined phase rotations to the respective tones of the plurality of tones, and to transmit the signal based on the phase rotations applied to the plurality of tones of the signal. In some implementations, the phase rotations may be determined without considering preamble puncturing for the transmitted signal. In some other implementations, the phase rotations may be determined without considering front end bandwidths used to transmit the signal. The bandwidth mode may be one of 20

MHz, 40 MHz, 80 MHz, 160 MHz, or 80+80 MHz, and the method may also include applying a selected multiplier value of a plurality of multiplier values to each tone of the plurality of tones that falls within the carrier index range, where each tone of the plurality of tones that falls within the carrier index range is pre-EHT modulated.

BRIEF DESCRIPTION OF THE DRAWINGS

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

Like reference numbers and designations in the various drawings indicate like elements.

DETAILED DESCRIPTION

Figure 1:
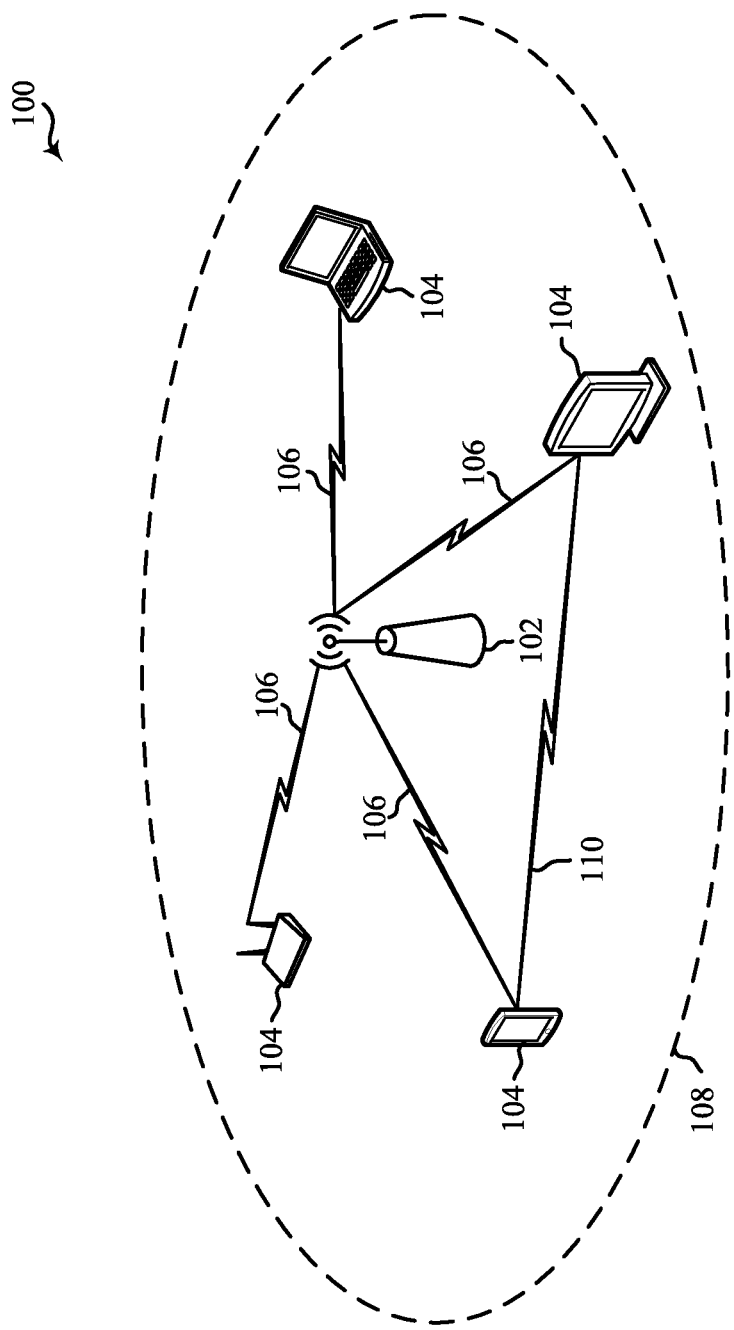
FIG. 1 shows a pictorial diagram of an example wireless communication network.

The following description is directed to some particular implementations for the purposes of describing innovative aspects of this disclosure. However, a person having ordinary skill in the art will readily recognize that the teachings herein can be applied in a multitude of different ways. The described implementations can be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G or 5G (New Radio (NR)) standards promulgated by the 3rd Generation Partnership Project (3GPP), among others. The described implementations can be implemented in any device, system or network that is capable of transmitting and receiving RF signals according to one or more of the following technologies or techniques: code division multiple access (CDMA), time division multiple access (TDMA), frequency division multiple access (FDMA), orthogonal FDMA (OFDMA), single-carrier FDMA (SC-FDMA), single-user (SU) multiple-input multiple-output (MIMO) and multi-user (MU) MIMO. The described implementations also can be implemented using other wireless communication protocols or RF signals suitable for use in one or more of a wireless personal area network (WPAN), a wireless local area network (WLAN), a wireless wide area network (WWAN), or an internet of things (IOT) network.

Various implementations relate generally to determining phase rotation parameters for wireless transmissions. Some implementations more specifically relate to defining phase rotation values to be applied to particular fields (or symbols) of non-legacy physical-layer (PHY) protocol data units (PPDUs). The non-legacy PPDUs may be extremely high throughput (EHT) PPDUs, for example, as specified in the IEEE 802.11be amendment to the IEEE 802.11 family of standards. The EHT PPDUs may include pre-EHT modulated fields (or symbols) and EHT modulated fields (or symbols). In some implementations, the phase rotation values may be defined to apply to the pre-EHT modulated fields (or symbols) of the EHT PPDUs. In some implementations, phase rotation values may be defined for each of a multitude of different frequency bandwidths, and may be separately defined for contiguous frequency bandwidths and non-contiguous frequency bandwidths. In some aspects, the phase rotation values defined herein may be compatible with phase rotation values defined in one or more pre-EHT versions of the IEEE 802.11 family of standards. As used herein, the term "pre-EHT" refers to features specified in IEEE 802.11 amendments prior to the IEEE 802.11be amendment to the IEEE 802.11 family of standards. It will be understood, however, that the systems, methods and devices of this disclosure may similarly apply to communications governed by any future amendments to the IEEE 802.11 family of standards.

Legacy (or "pre-EHT") wireless devices, such as HE devices, may be wireless devices that are compatible with pre-EHT versions of or amendments to the IEEE 802.11 family of standards (such as the IEEE 802.11ac/n/ax standards). Pre-EHT wireless devices may have front end bandwidths of 80 MHz. When a wireless communication device operates in a noncontiguous 80+80 MHz bandwidth mode, signals for transmission may be generated by two different transmit chains each having a bandwidth of 80 MHz (and each coupled to a different PA). In some implementations, each of the two different transmit chains may use phase rotation parameters configured to reduce the PAPR of the respective transmit chain irrespective of the phase rotation parameters used by the other transmit chain.

Emerging IEEE standards may support wider front end bandwidths, such as 160 MHz. When a wireless communication device operates in a noncontiguous 160+160 MHz bandwidth mode, signals for transmission may be generated by two different transmit chains each having a bandwidth of 160 MHz (and each coupled to a different PA). In some implementations, each of the two different transmit chains may use phase rotation parameters configured to reduce the PAPR of the respective transmit chain irrespective of the phase rotation parameters used by the other transmit chain.

Emerging IEEE standards may also support even wider bandwidth modes, such as a contiguous 240 MHz bandwidth mode, a contiguous 320 MHz bandwidth mode, a noncontiguous 160+160 MHz bandwidth mode, or a noncontiguous 80+80+80+80 (or "4×80") MHz bandwidth mode. The phase rotation values may be defined for pre-EHT preambles in each of a plurality of different contiguous bandwidth modes including 240 MHz or 320 MHz, or in each of a plurality of different non-contiguous bandwidth modes including 160+160 MHz or 80+80+80+80 MHz. When a wireless communication device operates in a contiguous 320 MHz bandwidth mode, signals for transmission may be generated by two different transmit chains each having a bandwidth of 160 MHz (and each coupled to a different PA). In some implementations, each of the two different transmit chains may use phase rotation parameters configured to reduce the PAPR of the respective transmit chain irrespective of the phase rotation parameters used by the other transmit chain.

Particular implementations of the subject matter described in this disclosure can be implemented to realize one or more of the following potential advantages. In some implementations, phase rotation values may be used to minimize the PAPR of time-domain signals for preambles or for RF front ends used for communications defined by one or more versions of or amendments to the IEEE 802.11 family of standards.

FIG. 1 shows a block diagram of an example wireless communication network 100. According to some aspects, the wireless communication network 100 can be an example of a wireless local area network (WLAN) such as a Wi-Fi network (and will hereinafter be referred to as WLAN 100). For example, the WLAN 100 can be a network implementing at least one of the IEEE 802.11 family of standards (such as that defined by the IEEE 802.11-2016 specification or amendments thereof). The WLAN 100 may include numerous wireless communication devices such as an access point (AP) 102 and multiple stations (STAs) 104. Each of the STAs 104 also may be referred to as a mobile station (MS), a mobile device, a mobile handset, a wireless handset, an access terminal (AT), a user equipment (UE), a subscriber station (SS), or a subscriber unit, among other possibilities. The STAs 104 may represent various devices such as mobile phones, personal digital assistant (PDAs), other handheld devices, netbooks, notebook computers, tablet computers, laptops, display devices (for example, TVs, computer monitors, navigation systems, among others), music or other audio or stereo devices, remote control devices ("remotes"), printers, kitchen or other household appliances, key fobs (for example, for passive keyless entry and start (PKES) systems), among other possibilities.

A single AP 102 and an associated set of STAs 104 may be referred to as a basic service set (BSS), which is managed by the respective AP 102. The BSS is identified by a service set identifier (SSID) that is advertised by the AP 102. The AP 102 periodically broadcasts beacon frames ("beacons") to enable any STAs 104 within wireless range of the AP 102 to establish or maintain a respective communication link 106 (hereinafter also referred to as a "Wi-Fi link") with the AP 102. For example, the beacons can include an identification of a primary channel used by the respective AP 102 as well as a timing synchronization function for establishing or maintaining timing synchronization with the AP 102. The various STAs 104 in the WLAN are able to communicate with external networks as well as with one another via the AP 102 and respective communication links 106. To establish a Wi-Fi link 106 with an AP 102, each of the STAs 104 is configured to perform passive or active scanning operations ("scans") on frequency channels in one or more frequency bands (for example, the 2.4 GHz, 5 GHz, 6 GHz or 60 GHz bands). To perform passive scanning, a STA 104 listens for beacons, which are transmitted by respective APs 102 at a periodic time interval referred to as the target beacon transmission time (TBTT) (measured in time units (TUs) where one TU is equal to 1024 microseconds (s)). To perform active scanning, a STA 104 generates and sequentially transmits probe requests on each channel to be scanned and listens for probe responses from APs 102. Each STA 104 may be configured to identify or select an AP 102 with which to associate based on the scanning information obtained through the passive or active scans, and to perform authentication and association operations to establish a Wi-Fi link 106 with the selected AP 102.

FIG. 1 additionally shows an example coverage area 108 of the AP 102, which may represent a basic service area (BSA) of the WLAN 100. While only one AP 102 is shown, the WLAN network 100 can include multiple APs 102. As a result of the increasing ubiquity of wireless networks, a STA 104 may have the opportunity to select one of many B9 within range of the STA or select among multiple APs 102 that together form an extended service set (ESS) including multiple connected B9. An extended network station associated with the WLAN 100 may be connected to a wired or wireless distribution system that may enable multiple APs 102 to be connected in such an ESS. As such, a STA 104 can be covered by more than one AP 102 and can associate with different APs 102 at different times for different transmissions. Additionally, after association with an AP 102, a STA 104 also may be configured to periodically scan its surroundings to find a more suitable AP 102 with which to associate. For example, a STA 104 that is moving relative to its associated AP 102 may perform a "roaming" scan to find another AP 102 having more desirable network characteristics such as a greater received signal strength indicator (RSSI) or a reduced traffic load.

In some cases, STAs 104 may form networks without APs 102 or other equipment other than the STAs 104 themselves. One example of such a network is an ad hoc network (or wireless ad hoc network). Ad hoc networks may alternatively be referred to as mesh networks or peer-to-peer (P2P) connections. In some cases, ad hoc networks may be implemented within a larger wireless network such as the WLAN 100. In such implementations, while the STAs 104 may be capable of communicating with each other through the AP 102 using communication links 106, STAs 104 also can communicate directly with each other via direct wireless links 110. Additionally, two STAs 104 may communicate via a direct communication link 110 regardless of whether both STAs 104 are associated with and served by the same AP 102. In such an ad hoc system, one or more of the STAs 104 may assume the role filled by the AP 102 in a BSS. Such a STA 104 may be referred to as a group owner (GO) and may coordinate transmissions within the ad hoc network. Examples of direct wireless links 110 include Wi-Fi Direct connections, connections established by using a Wi-Fi Tunneled Direct Link Setup (TDLS) link, and other P2P group connections.

Some APs and STAs support beamforming. Beamforming refers to the focusing of the energy of a transmission in the direction of a target receiver. Beamforming may be used both in a single user context, for example, to improve a signal-to-noise ratio (SNR), as well as in a multi-user (MU) context, for example, to enable MU multiple-input multiple-output (MIMO) transmissions. To perform beamforming, a transmitter, referred to as the beamformer, transmits a signal from multiple antenna elements of an antenna array. The beamformer configures the phase shifts between the signals transmitted from the different antenna elements such that the signals add constructively along particular directions towards the intended receivers, which are referred to as beamformees. The manner in which the beamformer configures the phase shifts depends on channel state information associated with the wireless channels over which the beamformer intends to communicate with the beamformees. To obtain the channel state information, the beamformer may perform a channel sounding procedure with the beamformees. For example, the beamformer may transmit one or more sounding packets to the beamformees. The beamformees may then perform measurements of the channel based on the sounding packets and subsequently provide feedback to the beamformer based on the measurements, for example, in the form of a feedback matrix. The beamformer may then generate a steering matrix for each of the beamformees based on the feedback and use the steering matrix to configure the phase shifts for subsequent transmissions to the beamformees.

The APs 102 and STAs 104 may function and communicate (via the respective Wi-Fi links 106) according to the IEEE 802.11 family of standards (such as that defined by the IEEE 802.11-2016 specification or amendments thereof including, but not limited to, 802.11ay, 802.11ax, 802.11az, 802.11be. These standards define the WLAN radio and baseband protocols for the PHY and medium access control (MAC) layers. The APs 102 and STAs 104 transmit and receive wireless communications (hereinafter also referred to as "Wi-Fi communications") to and from one another in the form of physical layer (PHY) protocol data units (PPDUs). The APs 102 and STAs 104 in the WLAN 100 may transmit PPDUs over an unlicensed spectrum, which may be a portion of spectrum that includes frequency bands traditionally used by Wi-Fi technology, such as the 2.4 GHz band, the 5 GHz band, the 60 GHz band, the 3.6 GHz band, and the 900 MHz band. Some implementations of the APs 102 and STAs 104 described herein also may communicate in other frequency bands, such as the 6 GHz band, which may support both licensed and unlicensed communications. The APs 102 and STAs 104 also can be configured to communicate over other frequency bands such as shared licensed frequency bands, where multiple operators may have a license to operate in the same or overlapping frequency band or bands.

Each of the frequency bands may include multiple sub-bands or frequency channels. For example, PPDUs conforming to the IEEE 802.11n, 802.11ac and 802.11ax standard amendments may be transmitted over the 2.4 and 5 GHz bands, each of which is divided into multiple 20 MHz channels. As such, these PPDUs are transmitted over a physical channel having a minimum bandwidth of 20 MHz. But larger channels can be formed through channel bonding. For example, PPDUs conforming to the IEEE 802.11n, 802.11ac and 802.11ax standard amendments may be transmitted over physical channels having bandwidths of 40 MHz, 80 MHz or 160 MHz by bonding together two or more 20 MHz channels.

Each PPDU is a composite structure that includes a PHY preamble and a physical layer convergence protocol (PLCP) service data unit (PSDU). The information provided in the preamble may be used by a receiving device to decode the subsequent data in the PSDU. A legacy (or "pre-EHT") portion of the preamble may include a number of pre-EHT modulated fields (or symbols), such as a legacy short training field (STF) (L-STF), a legacy long training field (LTF) (L-LTF), and a legacy signaling field (L-SIG). The pre-EHT preamble may be used for packet detection, automatic gain control, and channel estimation, among other uses. The pre-EHT preamble also may be used to maintain compatibility with legacy (or "pre-EHT") devices. In instances in which PPDUs are transmitted over a bonded channel, the L-STF, L-LTF, and L-SIG fields may be duplicated and transmitted in each of the multiple component channels. For example, in IEEE 802.11n, 802.11ac, or 802.11ax implementations, the L-STF, L-LTF, and L-SIG fields may be duplicated and transmitted in each of the component 20 MHz channels. The format of, coding of, and information provided in the non-legacy (or "EHT") portion of the preamble is based on the particular IEEE 802.11 protocol.

APs 102 and STAs 104 can support multi-user (MU) transmissions; that is, concurrent transmissions from one device to each of multiple devices (for example, multiple simultaneous downlink (DL) communications from an AP 102 to corresponding STAs 104), or concurrent transmissions from multiple devices to a single device (for example, multiple simultaneous uplink (UP) transmissions from corresponding STAs 104 to an AP 102). To support the MU transmissions, the APs 102 and STAs 104 may utilize multi-user orthogonal frequency division multiple access (MU-OFDMA) and multi-user multiple-input, multiple-output (MU-MIMO) techniques.

In MU-OFDMA schemes, the available frequency spectrum of the wireless channel may be divided into multiple resource units (RUs) each including a number of different frequency subcarriers ("tones"). Different RUs may be allocated or assigned by an AP 102 to different STAs 104 at particular times. The sizes and distributions of the RUs may be referred to as an RU allocation. RUs may be allocated in 2 MHz intervals, and as such, the smallest RU includes 26 tones consisting of 24 data tones and 2 pilot tones. As such, in a 20 MHz channel, up to 9 RUs (such as 2 MHz, 26-tone RUs) may be allocated (because some tones are reserved for other purposes). Similarly, in a 160 MHz channel, up to 74 RUs may be allocated. Therefore, it may be possible to schedule as many as 74 STAs 104 for MU-OFDMA transmissions. Larger 52 tone, 106 tone, 242 tone, 484 tone and 996 tone RUs may also be allocated. Adjacent RUs may be separated by a null subcarrier (such as a DC subcarrier), for example, to reduce interference between adjacent RUs, to reduce receiver DC offset, and to avoid transmit center frequency leakage.

For UL MU transmissions, an AP 102 can transmit a trigger frame to initiate and synchronize an UL MU-OFDMA or UL MU-MIMO transmission from multiple STAs 104 to the AP 102. Such trigger frames may thus enable multiple STAs 104 to send UL traffic to the AP 102 concurrently in time. A trigger frame may address one or more STAs 104 through respective association identifiers (AIDs), and may assign each AID one or more RUs that can be used to send UL traffic to the AP 102. The AP also may designate one or more random access (RA) RUs that unscheduled STAs 104 may contend for.

Figure 2A:
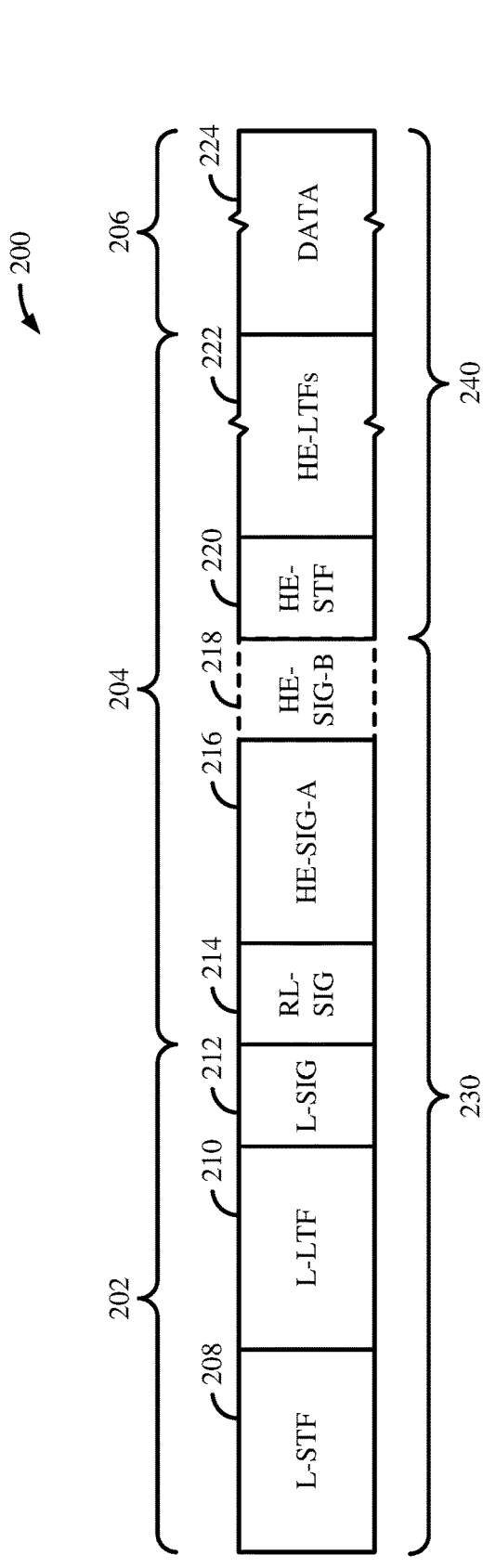
FIG. 2A shows an example protocol data unit (PDU) usable for wireless communication between an access point (AP) and a number of stations (STAs).

FIG. 2A shows an example PDU 200 usable for wireless communication between an AP and a number of STAs. The PDU 200 may be used for MU-OFDMA or MU-MIMO transmissions. The PDU 200 includes a PHY preamble including a first portion 202 and a second portion 204. The PDU 200 may further include a PHY payload 206 after the preamble, for example, in the form of a PSDU including a DATA field 224. The DATA field 224 may include a number of DATA fields (or symbols). The first portion 202 of the preamble includes a legacy short training field (STF) (L-STF) 208, a legacy long training field (LTF) (L-LTF) 210, and a legacy signaling field (L-SIG) 212. The HE-STF 220, HE-LTFs 222, and the DATA field 224 may be formatted as a High Efficiency (HE) WLAN preamble and frame, respectively, in accordance with the IEEE 802.11ax amendment to the IEEE 802.11 wireless communication protocol standard. The second portion 204 includes a repeated legacy signal field (RL-SIG) 214, a first HE signal field (HE-SIG-A) 216, a second HE signal field (HE-SIG-B) 218 encoded separately from HE-SIG-A 216, an HE short training field (HE-STF) 220, and a number of HE long training fields (or symbols) (HE-LTFs) 222. Like the L-STF 208, L-LTF 210, and L-SIG 212, the information in RL-SIG 214 and HE-SIG-A 216 may be duplicated and transmitted in each of the component 20 MHz channels in instances involving the use of a bonded channel. In contrast, HE-SIG-B 218 may be unique to each 20 MHz channel and may target specific STAs 104. In some implementations, the PDU 200 may not include HE-SIG-B 218, as indicated by the dashed lines. For example, if the PDU 200 is an HE MU PPDU, the PDU 200 may include HE-SIG-B 218, and if the PDU 200 is not an HE MU PPDU, the PDU 200 may not include HE-SIG-B 218.

The PDU 200 includes a number of pre-HE modulated fields (or symbols) 230, such as L-STF 208, L-LTF 210, L-SIG 212, RL-SIG 214, HE-SIG-A 216, and HE-SIG-B 218. The PDU 200 also includes a number of HE modulated fields (or symbols) 240, such as HE-STF 220, HE-LTFs 222, and DATA field 224. In some implementations, phase rotations may be defined for (and applied to) each of L-STF 208, L-LTF 210, L-SIG 212, RL-SIG 214, HE-SIG-A 216, and HE-SIG-B 218 of the preamble of the PDU 200, for example, because they are each a pre-HE modulated field. In some aspects, the same phase rotation may be applied to each of L-STF 208, L-LTF 210, L-SIG 212, RL-SIG 214, HE-SIG-A 216, and HE-SIG-B 218.

RL-SIG 214 may indicate to HE-compatible STAs 104 that the PDU 200 is an HE PPDU. An AP 102 may use HE-SIG-A 216 to identify and inform multiple STAs 104 that the AP has scheduled UL or DL resources for them. HE-SIG-A 216 may be decoded by each HE-compatible STA 104 served by the AP 102. HE-SIG-A 216 includes information usable by each identified STA 104 to decode an associated HE-SIG-B 218. For example, HE-SIG-A 216 may indicate the frame format, including locations and lengths of HE-SIG-Bs 218, available channel bandwidths, modulation and coding schemes (MCSs), among other possibilities. HE-SIG-A 216 also may include HE WLAN signaling information usable by STAs 104 other than the number of identified STAs 104.

HE-SIG-B 218 may carry STA-specific scheduling information such as, for example, per-user MCS values and per-user RU allocation information. In the context of DL MU-OFDMA, such information enables the respective STAs 104 to identify and decode corresponding RUs in the associated data field. Each HE-SIG-B 218 includes a common field and at least one STA-specific ("user-specific") field. The common field can indicate RU distributions to multiple STAs 104, indicate the RU assignments in the frequency domain, indicate which RUs are allocated for MU-MIMO transmissions and which RUs correspond to MU-OFDMA transmissions, and the number of users in allocations, among other possibilities. The common field may be encoded with common bits, CRC bits, and tail bits. The user-specific fields are assigned to particular STAs 104 and may be used to schedule specific RUs and to indicate the scheduling to other WLAN devices. Each user-specific field may include multiple user block fields (which may be followed by padding). Each user block field may include two user fields that contain information for two respective STAs to decode their respective RU payloads in DATA field 224.

Figure 2B:
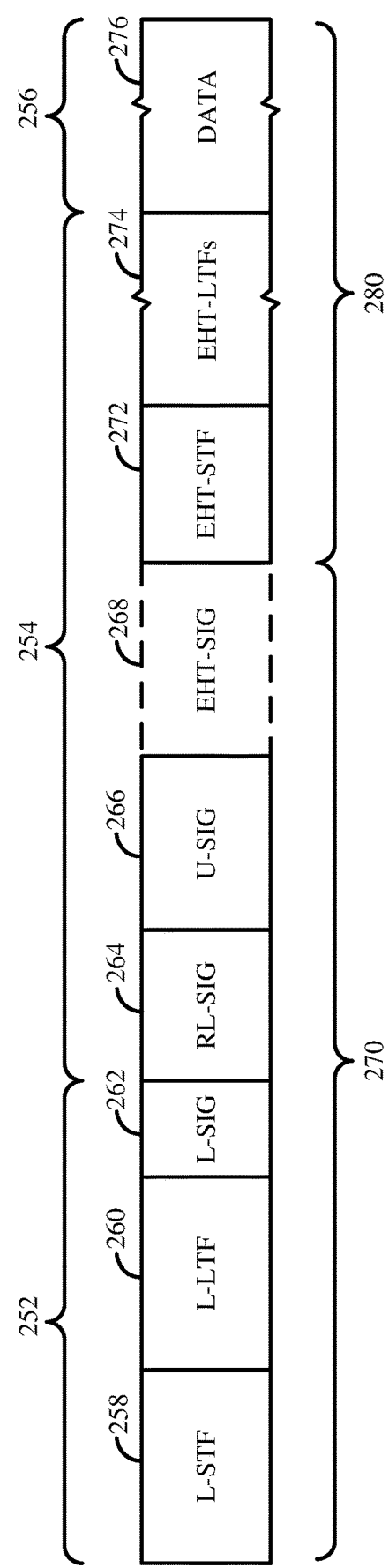
FIG. 2B shows an example physical-layer (PHY) protocol data units (PPDU) usable for wireless communication between an AP and a number of STAs.

FIG. 2B shows an example PPDU 250 usable for wireless communication between an AP and a number of STAs according to some implementations. The PPDU 250 may be used for SU, MU-OFDMA, or MU-MIMO transmissions. The PPDU 250 includes a PHY preamble including a first portion 252 and a second portion 254. The PPDU 250 may further include a PHY payload 256 after the preamble, for example, in the form of a PSDU including a DATA field 276. The first portion 252 of the preamble includes a legacy short training field (STF) (L-STF) 258, a legacy long training field (LTF) (L-LTF) 260, and a legacy signaling field (L-SIG) 262. The EHT-STF 272, the EHT-LTFs 274, and the DATA field 276 may be formatted as an Extreme High Throughput (EHT) WLAN preamble and frame, respectively, in accordance with the IEEE 802.11be amendment to the IEEE 802.11 wireless communication protocol standard, or may be formatted as a preamble and frame, respectively, conforming to any later (post-EHT) version of a new wireless communication protocol conforming to a future IEEE 802.11 wireless communication protocol standard or other wireless communication standard.

The second portion 254 of the preamble includes a repeated legacy signal field (RL-SIG) 264 and multiple wireless communication protocol version-dependent signal fields after RL-SIG 264. For example, the second portion 254 may include a universal signal field 266 (referred to herein as "U-SIG 266") and an EHT signal field 268 (referred to herein as "EHT-SIG 268"). One or both of U-SIG 266 and EHT-SIG 268 may be structured as, and carry version-dependent information for, other wireless communication protocol versions beyond EHT. In some implementations, the PPDU 250 may not include EHT-SIG 268, as indicated by the dashed lines. For example, if the PPDU 250 is of a first PPDU type, the PPDU 250 may include EHT-SIG 268, and if the PPDU 250 is of a second PPDU type, the PPDU 250 may not include EHT-SIG 268. The second portion 254 further includes an additional short training field 272 (referred to herein as "EHT-STF 272," although it may be structured as, and carry version-dependent information for, other wireless communication protocol versions beyond EHT) and a number of additional long training fields 274 (referred to herein as "EHT-LTFs 274," although they may be structured as, and carry version-dependent information for, other wireless communication protocol versions beyond EHT). Like L-STF 258, L-LTF 260, and L-SIG 262, the information in U-SIG 266 and EHT-SIG 268 may be duplicated and transmitted in each of the component 20 MHz channels in instances involving the use of a bonded channel. In some implementations, EHT-SIG 268 may additionally or alternatively carry information in one or more non-primary 20 MHz channels that is different than the information carried in the primary 20 MHz channel.

As described above, by applying specific phase rotations to particular tones, such as for pre-EHT modulated fields (or symbols), a transmitting device may reduce the peak-to-average power ratio (PAPR) of time domain signals to be transmitted on a wireless medium. The PPDU 250 includes a number of pre-EHT modulated fields (or symbols) 270, such as L-STF 258, L-LTF 260, L-SIG 262, RL-SIG 264, U-SIG 266, and EHT-SIG 268. The PPDU 250 also includes a number of EHT-modulated fields (or symbols) 280, such as EHT-STF 272, EHT-LTFs 274, and DATA field 276. Thus, in some implementations, phase rotations may be defined for (and applied to) each of L-STF 258, L-LTF 260, L-SIG 262, RL-SIG 264, U-SIG 266, and EHT-SIG 268 of the PPDU 250, for example, because they are each a pre-EHT modulated field.

EHT-SIG 268 may include one or more jointly encoded symbols and may be encoded in a different block from the block in which U-SIG 266 is encoded. EHT-SIG 268 may be used by an AP to identify and inform multiple STAs 104 that the AP has scheduled UL or DL resources. EHT-SIG 268 may be decoded by each compatible STA 104 served by the AP 102. EHT-SIG 268 may generally be used by a receiving device to interpret bits in one or more other fields, such as DATA field 276. For example, EHT-SIG 268 may indicate the resource allocation of DATA fields included in DATA field 276 in the various component channels, available channel bandwidths, and modulation and coding schemes (MCSs), among other possibilities. EHT-SIG 268 may further include a cyclic redundancy check (CRC) (for example, four bits) and a tail (for example, 6 bits) that may be used for binary convolutional code (BCC). In some implementations, EHT-SIG 268 may include a number of code blocks that each include a CRC and a tail. In some aspects, each of the number of code blocks may be encoded separately.

EHT-SIG 268 may carry STA-specific scheduling information such as, for example, per-user MCS values and per-user RU allocation information. EHT-SIG 268 may generally be used by a receiving device to interpret bits in the DATA field 276. In the context of DL MU-OFDMA, such information enables the respective STAs 104 to identify and decode corresponding RUs in the associated DATA field 276. Each EHT-SIG 268 may include a common field and at least one STA-specific ("user-specific") field. The common field can indicate RU distributions to multiple STAs 104, indicate the RU assignments in the frequency domain, indicate which RUs are allocated for MU-MIMO transmissions and which RUs correspond to MU-OFDMA transmissions, and the number of users in allocations, among other possibilities. The common field may be encoded with common bits, CRC bits, and tail bits. The user-specific fields are assigned to particular STAs 104 and may be used to schedule specific RUs and to indicate the scheduling to other WLAN devices. Each user-specific field may include multiple user block fields (which may be followed by padding). Each user block field may include, for example, two user fields that contain information for two respective STAs to decode their respective RU payloads.

U-SIG 266, and RL-SIG 264 if present, may indicate to EHT- or later version-compliant STAs 104 that the PPDU 250 is an EHT PPDU or a PPDU conforming to any later (post-EHT) version of a new wireless communication protocol conforming to a future IEEE 802.11 wireless communication protocol standard or other standard. For example, U-SIG 266 may be used by a receiving device to interpret bits in one or more of EHT-SIG 268 or the DATA field 276. In some implementations, U-SIG 266 may include a reserved bit that indicates whether the PPDU 250 is, for example, compliant with EHT or a later version of the IEEE 802.11 family of wireless communication protocol standards or other standards. In some implementations, U-SIG 266 includes a version field that includes at least one bit indicating the particular wireless communication protocol version to which the PPDU 250 conforms.

In the IEEE 802.11be amendment to the IEEE 802.11 family of standards (or in future amendments), new fields may be used to carry signaling information. For example, the new fields and signaling information may be included in U-SIG 266. Additionally, new fields and signaling information may be included in EHT-SIG 268. If additional training signals are sent on other tones prior to U-SIG (such as additional training signals in L-SIG and RL-SIG in 11ax), then each symbol in U-SIG may carry more usable data for feature signaling rather than training signals. In some implementations, U-SIG 266 includes two symbols, which may be jointly encoded together in a single block, and which may each carry twenty-six usable data (or "information") bits. For example, the bits in U-SIG 266 may include signaling regarding types or formats of additional signal fields (such as the EHT-SIG 268) that follows the U-SIG 266. EHT-SIG 268 may have a clear symbol boundary. In some implementations, a fixed MCS may be used for EHT-SIG 268. In some implementations, the MCS and DCM for EHT-SIG 268 may be indicated in U-SIG 266.

Figure 3:
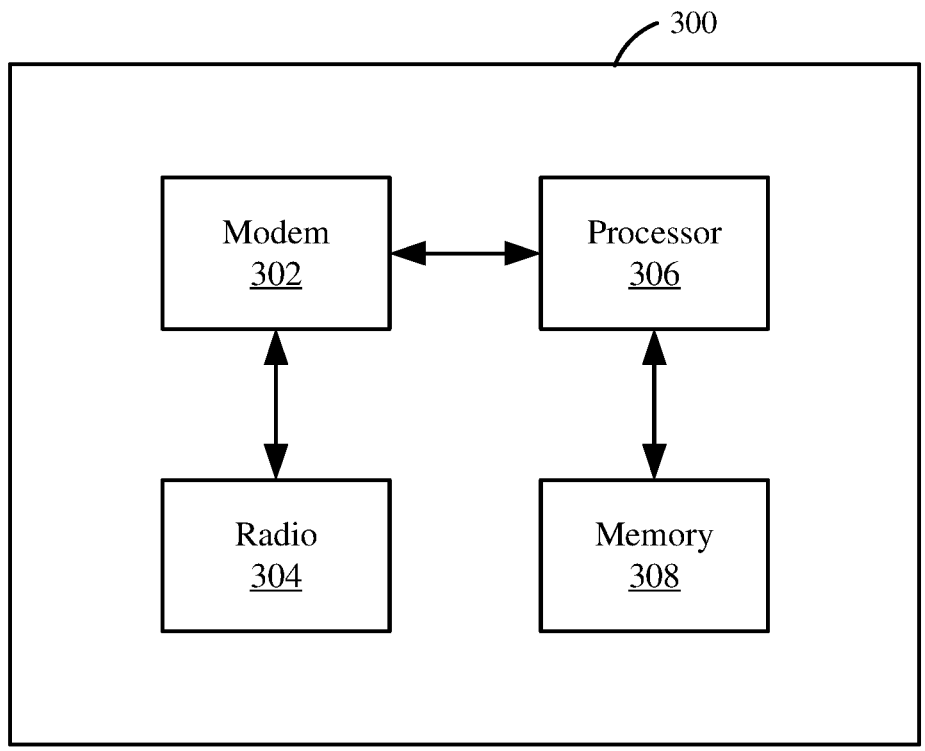
FIG. 3 shows a block diagram of an example wireless communication device.

FIG. 3 shows a block diagram of an example wireless communication device 300. In some implementations, the wireless communication device 300 can be an example of a device for use in a STA such as one of the STAs 104 described above with reference to FIG. 1. In some implementations, the wireless communication device 300 can be an example of a device for use in an AP such as the AP 102 described above with reference to FIG. 1. The wireless communication device 300 is capable of transmitting (or outputting for transmission) and receiving wireless communications (for example, in the form of wireless packets). For example, the wireless communication device can be configured to transmit and receive packets in the form of physical layer convergence protocol (PLCP) protocol data units (PPDUs) and medium access control (MAC) protocol data units (MPDUs) conforming to an IEEE 802.11 standard, such as that defined by the IEEE 802.11-2016 specification or amendments thereof including, but not limited to, 802.11ah, 802.11ad, 802.11ay, 802.11ax, 802.11az, 802.11ba, and 802.11be.

The wireless communication device 300 can be, or can include, a chip, system on chip (SoC), chipset, package, or device that includes one or more modems 302, for example, a Wi-Fi (IEEE 802.11 compliant) modem. In some implementations, the one or more modems 302 (collectively "the modem 302") additionally include a WWAN modem (for example, a 3GPP 4G LTE or 5G compliant modem). In some implementations, the wireless communication device 300 also includes one or more radios 304 (collectively "the radio 304"). In some implementations, the wireless communication device 306 further includes one or more processors, processing blocks or processing elements 306 (collectively "the processor 306"), and one or more memory blocks or elements 308 (collectively "the memory 308").

The modem 302 can include an intelligent hardware block or device such as, for example, an application-specific integrated circuit (ASIC) among other possibilities. The modem 302 is generally configured to implement a PHY layer. For example, the modem 302 is configured to modulate packets and to output the modulated packets to the radio 304 for transmission over the wireless medium. The modem 302 is similarly configured to obtain modulated packets received by the radio 304 and to demodulate the packets to provide demodulated packets. In addition to a modulator and a demodulator, the modem 302 may further include digital signal processing (DSP) circuitry, automatic gain control (AGC), a coder, a decoder, a multiplexer, and a demultiplexer. For example, while in a transmission mode, data obtained from the processor 306 is provided to a coder, which encodes the data to provide encoded bits. The encoded bits are then mapped to points in a modulation constellation (using a selected MCS) to provide modulated symbols. The modulated symbols may then be mapped to a number $N_{SS}$ of spatial streams or a number $N_{STS}$ of space-time streams. The modulated symbols in the respective spatial or space-time streams may then be multiplexed, transformed via an inverse fast Fourier transform (IFFT) block, and subsequently provided to the DSP circuitry for Tx windowing and filtering. The digital signals may then be provided to a digital-to-analog converter (DAC). The resultant analog signals may then be provided to a frequency upconverter, and ultimately, the radio 304. In implementations involving beamforming, the modulated symbols in the respective spatial streams are precoded via a steering matrix prior to their provision to the IFFT block.

While in a reception mode, digital signals received from the radio 304 are provided to the DSP circuitry, which is configured to acquire a received signal, for example, by detecting the presence of the signal and estimating the initial timing and frequency offsets. The DSP circuitry is further configured to digitally condition the digital signals, for example, using channel (narrowband) filtering, analog impairment conditioning (such as correcting for I/Q imbalance), and applying digital gain to ultimately obtain a narrowband signal. The output of the DSP circuitry may then be fed to the AGC, which is configured to use information extracted from the digital signals, for example, in one or more received training fields, to determine an appropriate gain. The output of the DSP circuitry also is coupled with the demodulator, which is configured to extract modulated symbols from the signal and, for example, compute the logarithm likelihood ratios (LLRs) for each bit position of each subcarrier in each spatial stream. The demodulator is coupled with the decoder, which may be configured to process the LLRs to provide decoded bits. The decoded bits from all of the spatial streams are then fed to the demultiplexer for demultiplexing. The demultiplexed bits may then be descrambled and provided to the MAC layer (the processor 306) for processing, evaluation, or interpretation.

The radio 304 generally includes at least one radio frequency (RF) transmitter (or "transmitter chain") and at least one RF receiver (or "receiver chain"), which may be combined into one or more transceivers. For example, the RF transmitters and receivers may include various DSP circuitry including at least one power amplifier (PA) and at least one low-noise amplifier (LNA), respectively. The RF transmitters and receivers may in turn be coupled to one or more antennas. For example, in some implementations, the wireless communication device 300 can include, or be coupled with, multiple transmit antennas (each with a corresponding transmit chain) and multiple receive antennas (each with a corresponding receive chain). The symbols output from the modem 302 are provided to the radio 304, which then transmits the symbols via the coupled antennas. Similarly, symbols received via the antennas are obtained by the radio 304, which then provides the symbols to the modem 302.

The processor 306 can include an intelligent hardware block or device such as, for example, a processing core, a processing block, a central processing unit (CPU), a microprocessor, a microcontroller, a digital signal processor (DSP), an application-specific integrated circuit (ASIC), a programmable logic device (PLD) such as a field programmable gate array (FPGA), discrete gate or transistor logic, discrete hardware components, or any combination thereof designed to perform the functions described herein. The processor 306 processes information received through the radio 304 and the modem 302, and processes information to be output through the modem 302 and the radio 304 for transmission through the wireless medium. For example, the processor 306 may implement a control plane and MAC layer configured to perform various operations related to the generation and transmission of MPDUs, frames, or packets. The MAC layer is configured to perform or facilitate the coding and decoding of frames, spatial multiplexing, space-time block coding (STBC), beamforming, and OFDMA resource allocation, among other operations or techniques. In some implementations, the processor 306 may generally control the modem 302 to cause the modem to perform various operations described above.

The memory 304 can include tangible storage media such as random-access memory (RAM) or read-only memory (ROM), or combinations thereof. The memory 304 also can store non-transitory processor- or computer-executable software (SW) code containing instructions that, when executed by the processor 306, cause the processor to perform various operations described herein for wireless communication, including the generation, transmission, reception, and interpretation of MPDUs, frames or packets. For example, various functions of components disclosed herein, or various blocks or steps of a method, operation, process, or algorithm disclosed herein, can be implemented as one or more modules of one or more computer programs.

Figure 4B:
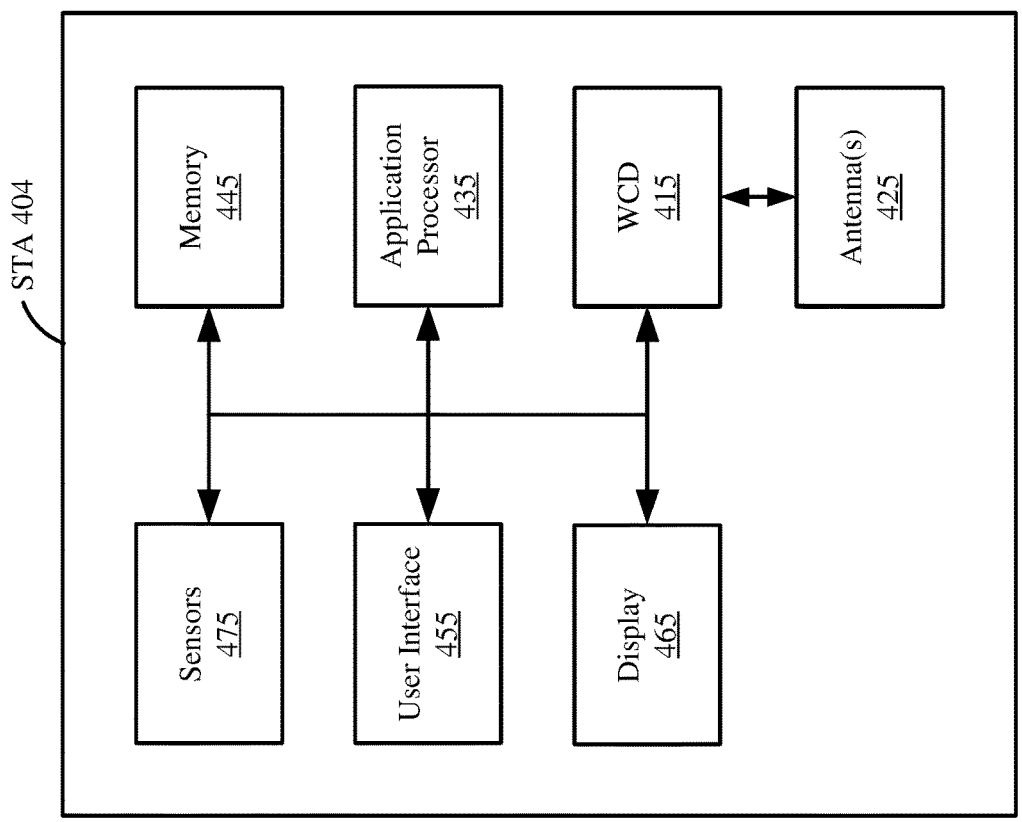
FIG. 4B shows a block diagram of an example station (STA).
Figure 4A:
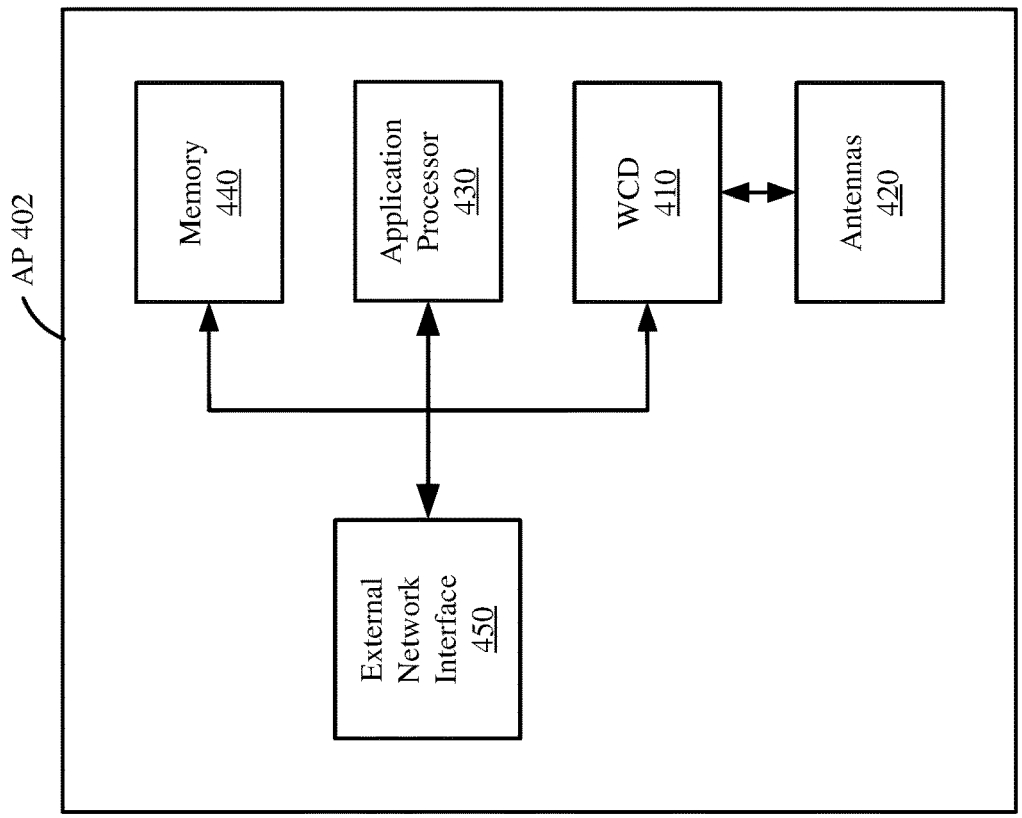
FIG. 4A shows a block diagram of an example access point (AP).

FIG. 4A shows a block diagram of an example AP 402. For example, the AP 402 can be an example implementation of the AP 102 described with reference to FIG. 1. The AP 402 includes a wireless communication device (WCD) 410. For example, the wireless communication device 410 may be an example implementation of the wireless communication device 300 described with reference to FIG. 3. The AP 402 also includes multiple antennas 420 coupled with the wireless communication device 410 to transmit and receive wireless communications. In some implementations, the AP 402 additionally includes an application processor 430 coupled with the wireless communication device 410, and a memory 440 coupled with the application processor 430. The AP 402 further includes at least one external network interface 450 that enables the AP 402 to communicate with a core network or backhaul network to gain access to external networks including the Internet. For example, the external network interface 450 may include one or both of a wired (for example, Ethernet) network interface and a wireless network interface (such as a WWAN interface). Ones of the aforementioned components can communicate with other ones of the components directly or indirectly, over at least one bus. The AP 402 further includes a housing that encompasses the wireless communication device 410, the application processor 430, the memory 440, and at least portions of the antennas 420 and external network interface 450.

FIG. 4B shows a block diagram of an example STA 404. For example, the STA 404 can be an example implementation of the STA 104 described with reference to FIG. 1. The STA 404 includes a wireless communication device 415. For example, the wireless communication device 415 may be an example implementation of the wireless communication device 300 described with reference to FIG. 3. The STA 404 also includes one or more antennas 425 coupled with the wireless communication device 415 to transmit and receive wireless communications. The STA 404 additionally includes an application processor 435 coupled with the wireless communication device 415, and a memory 445 coupled with the application processor 435. In some implementations, the STA 404 further includes a user interface (UI) 455 (such as a touchscreen or keypad) and a display 465, which may be integrated with the UI 455 to form a touchscreen display. In some implementations, the STA 404 may further include one or more sensors 475 such as, for example, one or more inertial sensors, accelerometers, temperature sensors, pressure sensors, or altitude sensors. Ones of the aforementioned components can communicate with other ones of the components directly or indirectly, over at least one bus. The STA 404 further includes a housing that encompasses the wireless communication device 415, the application processor 435, the memory 445, and at least portions of the antennas 425, UI 455, and display 465.

As described above, a wireless medium may be divided into a primary channel and one or more secondary channels. The primary and secondary channels may be of various bandwidths, and may occupy contiguous or non-contiguous portions of an available frequency spectrum. Larger channels can be formed through channel bonding. For example, the HE devices operating in accordance with IEEE 802.11ax may transmit PPDUs over physical channels having bandwidths of 40 MHz, 80 MHz, or 160 MHz by bonding together two or more 20 MHz channels.

Figure 5:
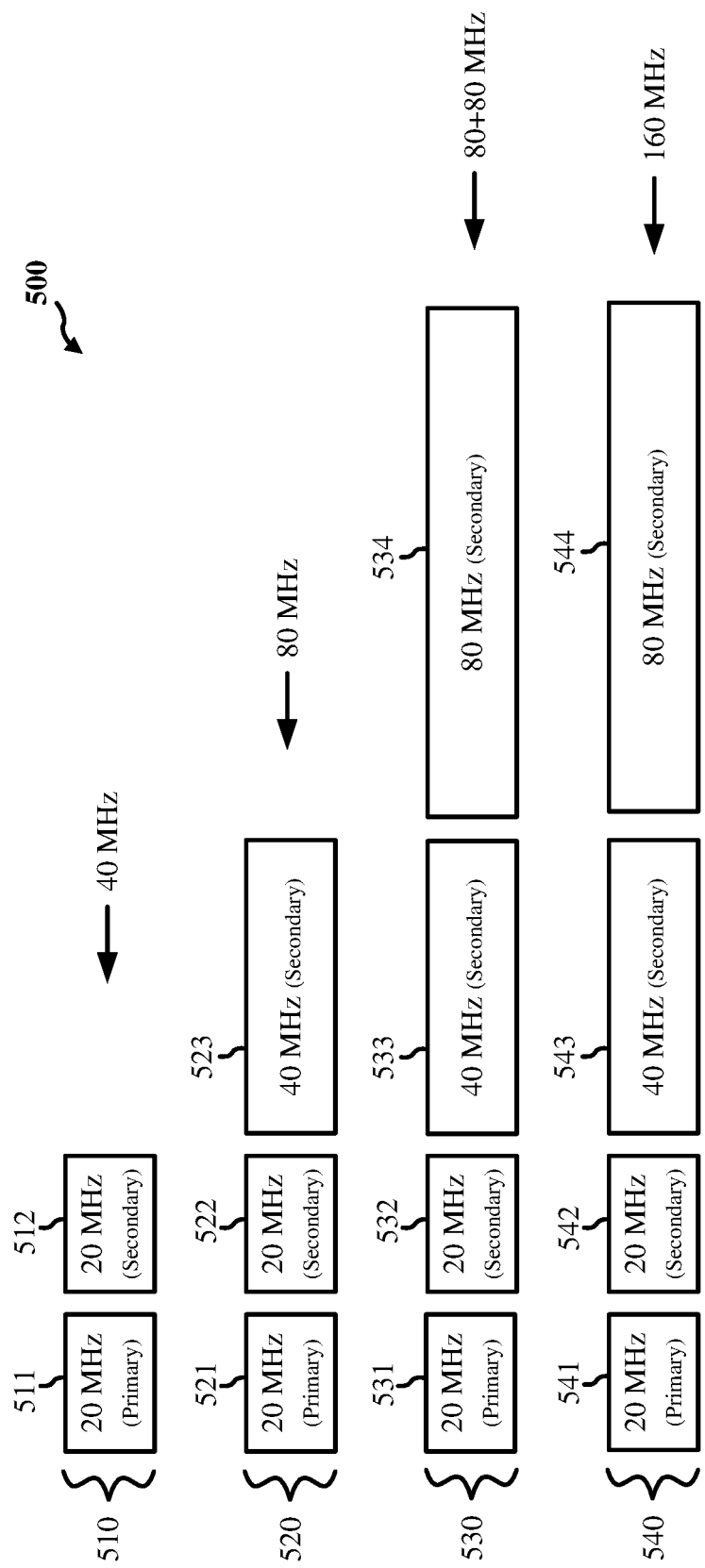
FIG. 5 shows an example channel bandwidth allocation map.

FIG. 5 shows an example channel bandwidth allocation map 500 of a wireless medium. The channel bandwidth allocation map 500, which may conform to the IEEE 802.11n, 802.11ac, and 802.11ax standard amendments, is shown to include four possible channel bandwidth allocations 510, 520, 530, and 540. The first example channel bandwidth allocation 510 divides a 40 MHz frequency spectrum into a primary 20 MHz channel 511 and a secondary 20 MHz channel 512. The second example channel bandwidth allocation 520 divides an 80 MHz frequency spectrum into a primary 20 MHz channel 521, a secondary 20 MHz channel 522 (which together form a primary 40 MHz channel), and a secondary 40 MHz channel 523. The third example channel bandwidth allocation 530 divides an 80+80 MHz frequency spectrum into a primary 20 MHz channel 531, a secondary 20 MHz channel 532 (which together form a primary 40 MHz channel), a secondary 40 MHz channel 533, and a secondary 80 MHz channel 534. The fourth example channel bandwidth allocation 540 divides a 160 MHz frequency spectrum into a primary 20 MHz channel 541, a secondary 20 MHz channel 542 (which together form a primary 40 MHz channel), a secondary 40 MHz channel 543, and a secondary 80 MHz channel 544.

As described above, by applying specific phase rotations to particular tones of a pre-EHT preamble, a transmitting device may reduce the peak-to-average power ratio (PAPR) of time domain signals to be transmitted on a wireless medium. Reducing the PAPR of the time domain signals may enable the power backoff provided to the power amplifier (PA) to be lowered, or may reduce signal distortion associated with the PA for a given power backoff. For pre-EHT communications (for example, HT, VHT, or HE communications defined in the IEEE 802.11n, 802.11ac and 802.11ax amendments), phase rotation parameters are defined to reduce the PAPR of time domain signals for a contiguous 160 MHz bandwidth mode or a noncontiguous 80+80 MHz bandwidth mode. When operating in a noncontiguous 80+80 MHz bandwidth mode, pre-EHT wireless devices having a front end bandwidth of 80 MHz may use two 80 MHz transmit chains for UL transmissions. Each transmit chain may include its own PA, and may apply phase rotation parameters configured to reduce the PAPR for the respective transmit chain, irrespective of the phase rotation parameters applied by the other transmit chain.

Emerging versions of the IEEE 802.11 standards, including the 802.11be amendment, may support wider front end bandwidths (such as 160 MHz) and may support wider bandwidth modes (such as a contiguous 240 MHz mode, a contiguous 320 MHz mode, a noncontiguous 160+160 MHz mode, and a noncontiguous 80+80+80+80 (or "4×80") MHz mode). When operating in a noncontiguous 160+160 MHz bandwidth mode, wireless devices having a front end bandwidth of 160 MHz may use two 160 MHz transmit chains for UL transmissions. Each transmit chain may include its own PA, and may apply phase rotation parameters configured to reduce the PAPR for the respective transmit chain, irrespective of the phase rotation parameters applied by the other transmit chain.

Various implementations relate generally to defining phase rotation parameters. Some implementations more specifically relate to defining phase rotation parameters for PPDU preambles for EHT communications (such as pre-EHT PPDU preambles defined in the IEEE 802.11be amendment to the IEEE 802.11 family of standards) or communications according to later amendments to the IEEE 802.11 family of standards. In some implementations, the phase rotation parameters may be defined for contiguous bandwidth modes including 240 MHz or 320 MHz, or for non-contiguous bandwidth modes including 160+160 MHz or 80+80+80+80 MHz. In some implementations, the phase rotation parameters may be defined for front end bandwidths of 160 MHz.

The subcarrier indices for a 80 MHz bandwidth can range from −128 to +127 for a total of 256 tones. To reduce PAPR for time domain signals in a contiguous 80 MHz PPDU transmission, the applied phase rotations may be defined as $$\gamma_{k,80} = \begin{cases} 1, & k < -64 \\ -1, & k > -64 \end{cases},$$

where ϒ represents the phase rotation, k represents the carrier index, and 80 represents the PPDU bandwidth (in MHz). That is, for subcarriers less than −64 (for example, the 1$^{st}$ 20 MHz sub-band lowest in frequency), the phase rotation may be 1, or, no rotation. For the remaining subcarriers (that are greater than or equal to −64, for example, the 2$^{nd}$, 3$^{rd}$ and 4$^{th}$ 20 MHz sub-bands), the phase rotation may be −1 (flipped). A phase rotation of −1 may be equivalent to a phase shift of 180 degrees in the frequency domain.

The subcarrier indices for a 160 MHz bandwidth can range from −256 to +255 for a total of 512 tones. To reduce PAPR for time domain signals in a contiguous 160 MHz PPDU transmission, the phase rotations may be defined as $$\gamma_{k,160} = \begin{cases} 1, & k < -192 \\ -1, & -192 \leq k < 0 \\ 1, & 0 \leq k < 64 \\ -1, & 64 \leq k \end{cases},$$

where ϒ represents the phase rotation, k represents the carrier index, and 160 represents the PPDU bandwidth (in MHz). Thus, for subcarriers less than −192 (for example, the 1$^{st}$ 20 MHz sub-band lowest in frequency), the phase rotation may be 1. For subcarriers greater than or equal to −192 and less than zero (for example, the 2$^{nd}$ 3$^{rd}$ and 4$^{th}$ 20 MHz sub-bands), the phase rotation may be −1. For subcarriers greater than or equal to 0 and less than 64 (for example, the 5$^{th}$ 20 MHz sub-band), the phase rotation may be 1. For subcarriers greater than or equal to 64 (for example, the 6$^{th}$, 7$^{th}$ and 8$^{th}$ 20 MHz sub-bands), the phase rotation may be −1. It will be appreciated that the first 1/−1 pair of phase rotation definitions (subcarriers below 0) represents the first 80 MHz frequency segment and the second 1/−1 pair of phase rotation definitions (subcarriers greater than or equal to 0) represents the second 80 MHz frequency segment of the 160 MHz bandwidth.

To minimize the PAPR for time domain signals in a noncontiguous PPDU transmission (such as an 80+80 MHz transmission), each 80 MHz frequency segment may use the phase rotation for 80 MHz PPDU transmissions ($\Upsilon_{k,80}$). Each of the lower 80 MHz segments (indices from −256 to −1) and the upper 80 MHz segments (indices from 0 to 255) may be defined in a manner similar to the phase rotation for 80 MHz PPDU transmissions ($\Upsilon_{k,80}$). In this manner, phase rotation in a contiguous 160 MHz and a noncontiguous 80+80 MHz may be unified.

In some implementations, phase rotations may be defined for existing bandwidth modes in a manner similar to the phase rotations already defined in pre-EHT standards, except for contiguous bandwidth modes (such as 160 MHz) for which an additional phase rotation (such as $\rho_{1,160}$) may be applied to further reduce the PAPR. In some aspects, $\rho$ may be a multiplier value applied to a weighted rotation on tones that fall within the carrier index range (such as 0≤k<64). As such, a peak power of the summation of the signal tones falling within the frequency bandwidth may be reduced, thereby reducing the PAPR for corresponding time domain signals.

In some implementations, $\rho$ may be predetermined. In some other implementations, a wireless device may select the value of $\rho$ from one or more $\rho$ values. In some other implementations, a wireless device may assign at least one of a number of $\rho$ values to a number of other wireless devices. For example, $|\rho_{1,160}|=1$ for an upper segment (such as an upper 80 MHz) of the bandwidth, and the PAPR for time domain signals in a contiguous 160 MHz PPDU transmission may be reduced by applying the phase rotations defined as $$\gamma_{k,160} = \begin{cases} 1, & k < -192 \\ -1, & -192 \leq k < 0 \\ \rho_{1,160}, & 0 \leq k < 64 \\ -\rho_{1,160}, & k \geq 64 \end{cases}.$$

As described above, in addition to supporting existing bandwidth modes, emerging IEEE standards (including 802.11be) may support a number of wider bandwidth modes. The wider bandwidth modes may include a number of "full" bandwidth modes, such as a contiguous 320 MHz bandwidth mode, a noncontiguous 160+160 MHz bandwidth mode, a noncontiguous 160+80+80 MHz bandwidth mode, and a noncontiguous 80+80+80+80 MHz bandwidth mode. The wider bandwidth modes may also include a number of "partial" bandwidth modes, such as a contiguous 240 MHz bandwidth mode, a noncontiguous 160+80 MHz bandwidth mode, and a noncontiguous 80+80+80 MHz bandwidth mode.

In some implementations, phase rotation parameters may be defined according to a full bandwidth design (such as for 320 MHz). In some aspects, phase rotations may be defined according to the full bandwidth design regardless of various preamble puncturing scenarios. That is, in some aspects, regardless of where one or multiple subband(s) may be punctured, the phase rotations may be defined according to the full bandwidth design, such as by starting at the punctured subband(s).

In some other implementations, the phase rotation parameters may depend on a bandwidth of an RF front end device (such as 320 MHz, 160 MHz, 80 MHz). In this way, the phase rotation parameters may be specified for each of a number of RF front end bandwidths, thereby minimizing the PAPR for the entire bandwidth. In some aspects, specifying phase rotation parameters for each of the number of RF front end bandwidths may reduce power amplifier (PA) distortion.

For example, a 80+80+80+80 MHz bandwidth mode may be multiplexed based on signal transmissions from four different transmit chains. Each of the four transmit chains may include its own power amplifier, and may provide 80 MHz of the total 320 MHz bandwidth. Thus, in some implementations, the phase rotation parameters may be specified for the bandwidth supported by each transmit chain. Despite this phase rotation design flexibility, one or more of the RF front ends may have the same or similar device parameters, and therefore the specified phase rotation parameters may be the same or similar for such devices.

In some other implementations, the phase rotation parameters may not depend on the front end bandwidth of the wireless device. In some examples, RF front end bandwidths may be different for different chipsets. In such examples, it may be more beneficial to define the phase rotation parameters irrespective of any RF front end bandwidths.

In some implementations, the phase rotation parameters may be backwards compatible with one or more pre-EHT standards, such with HE operation defined by the IEEE 802.11ax amendment. In some aspects, each 80 MHz or 160 MHz subband may follow a phase rotation design entirely according to the phase rotation design for the existing bandwidth modes of 80 MHz or 160 MHz, respectively. To reduce the PAPR for time domain signals in a contiguous 160 MHz PPDU transmission, the phase rotations may be defined as $$\gamma_{k,160} = \begin{cases} 1, & k < -192 \\ -1, & -192 \leq k < 0 \\ 1, & 0 \leq k < 64 \\ -1, & 64 \leq k \end{cases}.$$

In some other implementations, each 80 MHz or 160 MHz subband may follow a phase rotation design at least partially according to existing bandwidth modes, with additional design flexibility to further minimize the PAPR. All or a portion of the entire 80 MHz or 160 MHz subband may be subject to a further phase rotation, such as the application of a weighted rotation ($\rho$) on tones that fall within an assigned range of carrier indices (k). In some other aspects, the assigned range may include an entire subband of the existing bandwidth modes, such as the entire 80 MHz or 160 MHz subband. To minimize the PAPR for time domain signals in a contiguous 160 MHz PPDU transmission, the applied phase rotations may be defined as $$\gamma_{k,160} = \begin{cases} 1, & k < -192 \\ -1, & -192 \leq k < 0 \\ \rho_{1,160}, & 0 \leq k < 64 \\ -\rho_{1,160}, & k \geq 64 \end{cases}.$$

In some implementations, the phase rotation parameters may be unified for all bandwidth modes, including 240 MHz or 320 MHz, for example. In some other implementations, the phase rotation parameters may depend on individual subbands, which may depend on a corresponding bandwidth mode.

In some implementations, for a full bandwidth mode (such as 320 MHz), phase rotation parameters may be repeated for each of a number of bandwidth segments (such as four 80 MHz bandwidth segments) of the full bandwidth. In some aspects, the phase rotation parameters may be repeated regardless of the frequency order of the segments. The subcarrier indices for a 320 MHz bandwidth range from −512 to +511 for a total of 1024 tones, and to reduce the PAPR for time domain signals in a contiguous 320 MHz PPDU transmission, the applied phase rotations may be defined as $$\gamma_{k,320} = \begin{cases} 1, & k < -448 \\ -1, & -448 \leq k < -256 \\ 1, & -256 \leq k < -192 \\ -1, & -192 \leq k < 0 \\ 1, & 0 \leq k < 64 \\ -1, & 64 \leq k < 256 \\ 1, & 256 \leq k < 320 \\ -1, & 320 \leq k \end{cases},$$

where the first pair of parameters (the first-and-second lines) represents the first-of-four 80 MHz segments of the 320 MHz bandwidth, the second pair of parameters (the third-and-fourth lines, and so on) represents the second-of-four 80 MHz segments of the 320 MHz bandwidth, the third pair of parameters represents the third-of-four 80 MHz segments of the 320 MHz bandwidth, and the fourth pair of parameters represents the fourth-of-four 80 MHz segments of the 320 MHz bandwidth. These implementations, which utilize a simple 1/−1 pattern for each bandwidth segment pair, may allow for unified definition of phase rotation parameters in a new bandwidth mode (such as 320 MHz) without the need for additional optimization (as in Option 2).

In some implementations, for noncontiguous bandwidth modes (such as 160+80+80 MHz, 160+160 MHz, 80+80+80+80 MHz, 160+80 MHz, 80+80+80 MHz), each 80 MHz or 160 MHz frequency segment may be configured to use phase rotation parameters for 80 MHz or 160 MHz PPDU transmissions, respectively (such as those specified for existing bandwidth modes), regardless of subband order. That is, each 80 MHz subband (such as the lower 80 MHz in a 160 MHz subband, the upper 80 MHz in a 160 MHz subband, or both) may follow a phase rotation parameters for an 80 MHz PPDU for existing bandwidth modes. In this way, contiguous and noncontiguous bandwidth modes may be unified.

In some implementations, for a full bandwidth mode (such as 320 MHz), in addition to repeating phase rotation parameters for each of a number of bandwidth segments (as in Option 1), additional phase rotations may be applied to each bandwidth segment (such as to each of four 80 MHz bandwidth segments). In some aspects, a further phase rotation (such as $\rho_{1,320}$; $\rho_{2,320}$; $\rho_{3,320}$) may be applied to the tones to further minimize the PAPR. In some aspects, p may be a multiplier value applied to a weighted rotation on tones that fall within the carrier index range (such as 0≤k<64). In this way, a peak power of the summation of the signal tones falling within the frequency bandwidth may be reduced, thereby reducing the PAPR of the corresponding time domain signals.

In some implementations, to minimize the PAPR for time domain signals in a contiguous 320 MHz PPDU transmission, the applied phase rotations may be defined as $$\gamma_{k,320} = \begin{cases} 1, & k < -448 \\ -1, & -448 \leq k < -256 \\ \rho_{1,320}, & -256 \leq k < -192 \\ -\rho_{1,320}, & -192 \leq k < 0 \\ \rho_{2,320}, & 0 \leq k < 64 \\ -\rho_{2,320}, & 64 \leq k < 256 \\ \rho_{3,320}, & 256 \leq k < 320 \\ -\rho_{3,320}, & 320 \leq k \end{cases},$$

where $\rho_{0,320}=1$ (that is, no rotation), $\rho_{1,320}$, $\rho_{2,320}$, and $\rho_{3,320}$, where the value of $|\rho_{1,320}|=|\rho_{2,320}|=|\rho_{3,320}|=1$ (that is, no power amplification or power reduction for such tones).

In some implementations, for noncontiguous bandwidth modes (such as 160+80+80 MHz, 160+160 MHz, 80+80+80+80 MHz, 160+80 MHz, 80+80+80 MHz, among other bandwidth modes that utilize 320 MHz), regardless of subband order, each 80 MHz or 160 MHz frequency segment may be configured to use phase rotation parameters for 80 MHz or 160 MHz PPDU transmissions, respectively, such as those specified for existing bandwidth modes.

In some implementations, for a bandwidth mode that is narrower (such as a contiguous 240 MHz) than a full bandwidth mode (such as 320 MHz), the phase rotation parameters may be defined according to the phase rotation of the range of indices for the full bandwidth mode. As one having ordinary skill in the art will appreciate, the subcarrier indices for a full 320 MHz bandwidth range from −512 to +511. Thus, for a narrower bandwidth mode (such as 240 MHz), the phase rotation parameters (such as $\gamma_{k,240}$) may be defined from −512 to +255 from 320 MHz (using $\rho_{0,320}=1$, $\rho_{1,320}$, and $\rho_{2,320}$) or from −256 to +511 from 320 MHz (using $\rho_{1,320}$, $\rho_{2,320}$, and $\rho_{3,320}$).

In some implementations, phase rotation parameters may be defined to include a further phase rotation to a number of existing bandwidth modes (such as to an upper 80 MHz bandwidth segment in a 160 MHz subband). In such implementations, the phase rotation for new bandwidth modes (such as a contiguous 320 MHz and a contiguous 240 MHz) may not be changed. In this way, PAPR may be further reduced for existing bandwidth modes.

In some implementations, a full bandwidth mode (such as 320 MHz) may include an index value for each of a number of bandwidth segments of the full bandwidth (such as assigning index values 0-3 to the four 80 MHz bandwidth segments of the 320 MHz bandwidth, respectively). In some aspects, each of the bandwidth segments may be subject to a different further phase rotation, such as $\rho_{0,320}=1$, $\rho_{1,320}$, $\rho_{2,320}$, and $\rho_{3,320}$.

In some implementations, for noncontiguous bandwidth modes (such as 160+80+80 MHz, 160+160 MHz, 80+80+80+80 MHz, among other bandwidth modes that utilize 320 MHz), each bandwidth segment (such as each 80 MHz or 160 MHz bandwidth segment) may use the phase rotation for the corresponding global indices from the full bandwidth (such as 320 MHz). In some aspects, for example, an 80+160+80 MHz bandwidth segment may apply additional phase rotation according to: $\rho_{0,320}=1$ for the lowest 80 MHz subband; $\rho_{1,320}$ and $\rho_{2,320}$ for the middle 160 MHz subband; and $\rho_{3,320}$ for the highest 80 MHz subband. In some aspects, as another example, a 160+80+80 MHz bandwidth segment may apply additional phase rotation according to: $\rho_{0,320}=1$ and $\rho_{1,320}$ for the lowest 160 MHz subband; $\rho_{2,320}$ for the middle 80 MHz subband; and $\rho_{3,320}$ for the highest 80 MHz subband.

In some implementations, for contiguous bandwidth modes (such as 240 MHz), for noncontiguous bandwidth modes, or for both, the phase rotation parameters (such as $\gamma_{k,240}$) may be defined from −512 to +255 from 320 MHz (using $\rho_{0,320}=1$, $\rho_{1,320}$, and $\rho_{2,320}$) or from −256 to +511 from 320 MHz (using $\rho_{1,320}$, $\rho_{2,320}$, and $\rho_{3,320}$). In some aspects, for example, an 80+80+80 MHz bandwidth segment may apply additional phase rotation according to $\rho_{0,320}=1$, $\rho_{1,320}$, and $\rho_{2,320}$ for three 80 MHz subband (from lowest to highest in frequency) or according to $\rho_{1,320}$, $\rho_{2,320}$, and $\rho_{3,320}$ for three 80 MHz subband (from lowest to highest in frequency). In some aspects, as another example, a 160+80 MHz may apply additional phase rotation according to: $\rho_{0,320}=1$ and $\rho_{1,320}$ for 160 MHz subband and $\rho_{2,320}$ for 80 MHz subband; or $\rho_{1,320}$ and $\rho_{2,320}$ for 160 MHz subband and $\rho_{3,320}$ for 80 MHz subband (from lowest to highest in frequency).

Figure 6:
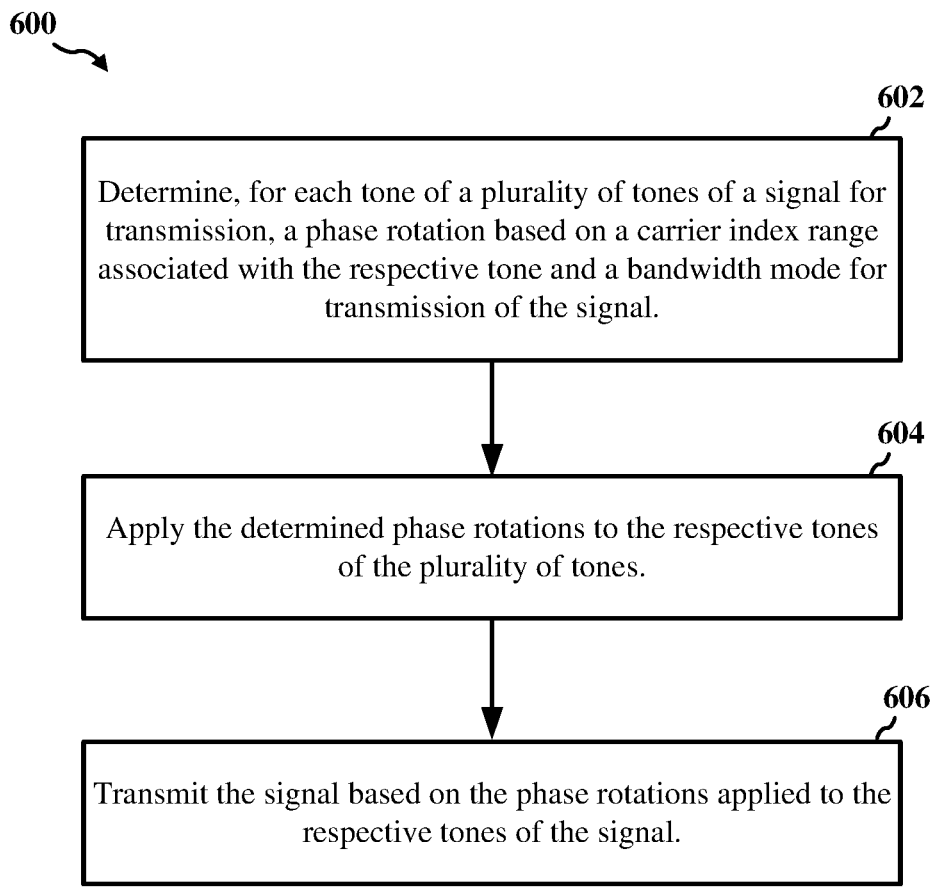
FIG. 6 shows a flowchart illustrating an example process for wireless communication that supports application of phase rotations to one or more tones of signals for transmission according to some implementations.

FIG. 6 shows a flowchart illustrating an example process 600 for wireless communication that supports application of phase rotations to one or more tones of signals for transmission according to some implementations. The operations of process 600 may be implemented by a STA or its components as described herein. For example, the process 600 may be performed by a wireless communication device such as the wireless communication device 400 described above with reference to FIG. 4. In some implementations, the process 600 may be performed by a wireless communication device operating as or within a STA, such as one of the STAs 104 and 504 described above with reference to FIGS. 1 and 5B, respectively.

In some implementations, in block 602, the wireless communication device determines, for each tone of a plurality of tones of a signal for transmission, a phase rotation based on a carrier index range associated with the respective tone and a bandwidth mode for transmission of the signal. At block 604, the wireless communication device applies the determined phase rotations to the respective tones of the plurality of tones. At block 606, the wireless communication device transmits the signal based on the application of the phase rotations to the plurality of tones of the signal.

In some implementations, determining the phase rotation in block 602 may be based on one or more front end bandwidths used to transmit the signal. In some other implementations, the phase rotations may be determined without considering front end bandwidths used to transmit the signal.

In some implementations, the bandwidth mode in block 602 is one of a 20 megahertz (MHz) mode, a 40 MHz mode, an 80 MHz mode, a 160 MHz mode, or an 80+80 MHz mode. In some instances for which the bandwidth mode is a 320 MHz mode, the phase rotations may be determined without considering preamble puncturing for the transmitted signal. In some instances for which the bandwidth mode is a 160 MHz mode, the phase rotations may be determined according to $$\gamma_{k,160} = \begin{cases} 1, & k < -192 \\ -1, & -192 \leq k < 0 \\ \rho_{1,160}, & 0 \leq k < 64 \\ -\rho_{1,160}, & k \geq 64 \end{cases},$$

where k is a carrier index value and $\gamma_{k,160}$ represents the $k^{th}$ phase rotation of the phase rotations.

In some other instances for which the bandwidth mode is a contiguous 160 MHz mode, the phase rotations may be determined according to $$\gamma_{k,160} = \begin{cases} 1, & k < -192 \\ -1, & -192 \leq k < 0 \\ 1, & 0 \leq k < 64 \\ -1, & 64 \leq k \end{cases},$$

where k is a carrier index value and $\gamma_{k,160}$ represents the $k^{th}$ phase rotation of the phase rotations.

Figure 7:
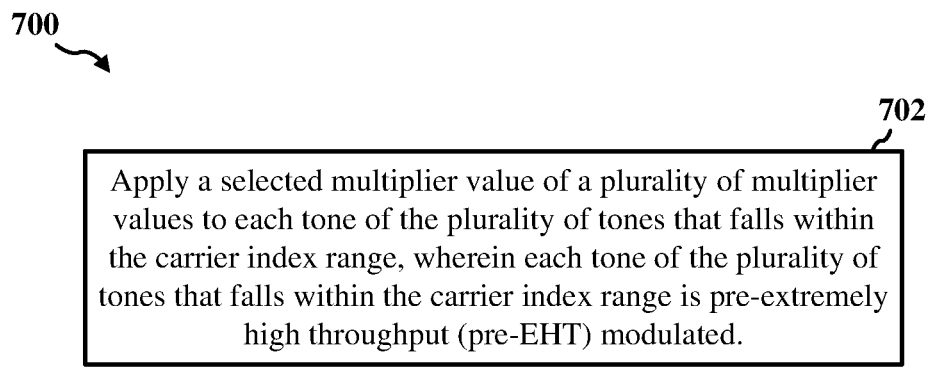
FIG. 7 shows a flowchart illustrating an example process for wireless communication that supports application of phase rotations to one or more tones of signals for transmission according to some implementations.

FIG. 7 shows a flowchart illustrating an example process 700 for wireless communication that supports application of phase rotations to one or more tones of signals for transmission according to some implementations. The operations of process 700 may be implemented by a STA or its components as described herein. For example, the process 700 may be performed by a wireless communication device such as the wireless communication device 300 described above with reference to FIG. 3. In some implementations, the process 700 may be performed by a wireless communication device operating as or within a STA, such as one of the STAs 104 and 404 described above with reference to FIGS. 1 and 4B, respectively.

In some implementations, the process 700 begins after transmitting the signal in block 606 of FIG. 6. For example, in block 702, the wireless communication device applies a selected multiplier value of a plurality of multiplier values to each tone of the plurality of tones that falls within the carrier index range, wherein each tone of the plurality of tones that falls within the carrier index range is pre-extremely high throughput (pre-EHT) modulated.

In some implementations, the bandwidth mode in block 602 is one of a 20 megahertz (MHz) mode, a 40 MHz mode, an 80 MHz mode, a 160 MHz mode, or an 80+80 MHz mode. In some instances for which the bandwidth mode is a 320 MHz mode, the phase rotations may be determined according to $$\gamma_{k,320} = \begin{cases} 1, & k < -448 \\ -1, & -448 \leq k < -256 \\ 1, & -256 \leq k < -192 \\ -1, & -192 \leq k < 0 \\ 1, & 0 \leq k < 64 \\ -1, & 64 \leq k < 256 \\ 1, & 256 \leq k < 320 \\ -1, & 320 \leq k \end{cases},$$

where ρ is a multiplier value to be applied to each tone of the plurality of tones that falls within the carrier index range, k is a carrier index value, and $\gamma_{k,320}$ represents the $k^{th}$ phase rotation of the phase rotations.

In some other instances for which the bandwidth mode is a 320 MHz mode, the phase rotations may be determined according to $$\gamma_{k,320} = \begin{cases} 1, & k < -448 \\ -1, & -448 \le k < -256 \\ \rho_{1,320}, & -256 \le k < -192 \\ -\rho_{1,320}, & -192 \le k < 0 \\ \rho_{2,320}, & 0 \le k < 64 \\ -\rho_{2,320}, & 64 \le k < 256 \\ \rho_{3,320}, & 256 \le k < 320 \\ -\rho_{3,320}, & 320 \le k \end{cases},$$

where ρ is a multiplier value to be applied to each tone of the plurality of tones that falls within the carrier index range, k is a carrier index value, and $\gamma_{k,320}$ represents the $k^{th}$ phase rotation of the phase rotations.

In some instances for which the bandwidth mode is a contiguous 160 MHz mode, the phase rotations may be determined according to $$\gamma_{k,160} = \begin{cases} 1, & k < -192 \\ -1, & -192 \le k < 0 \\ \rho_{1,160}, & 0 \le k < 64 \\ -\rho_{1,160}, & k \ge 64 \end{cases},$$

where ρ is a multiplier value to be applied to each tone of the plurality of tones that falls within the carrier index range, k is a carrier index value, and $\gamma_{k,160}$ represents the $k^{th}$ phase rotation of the phase rotations.

Figure 8:
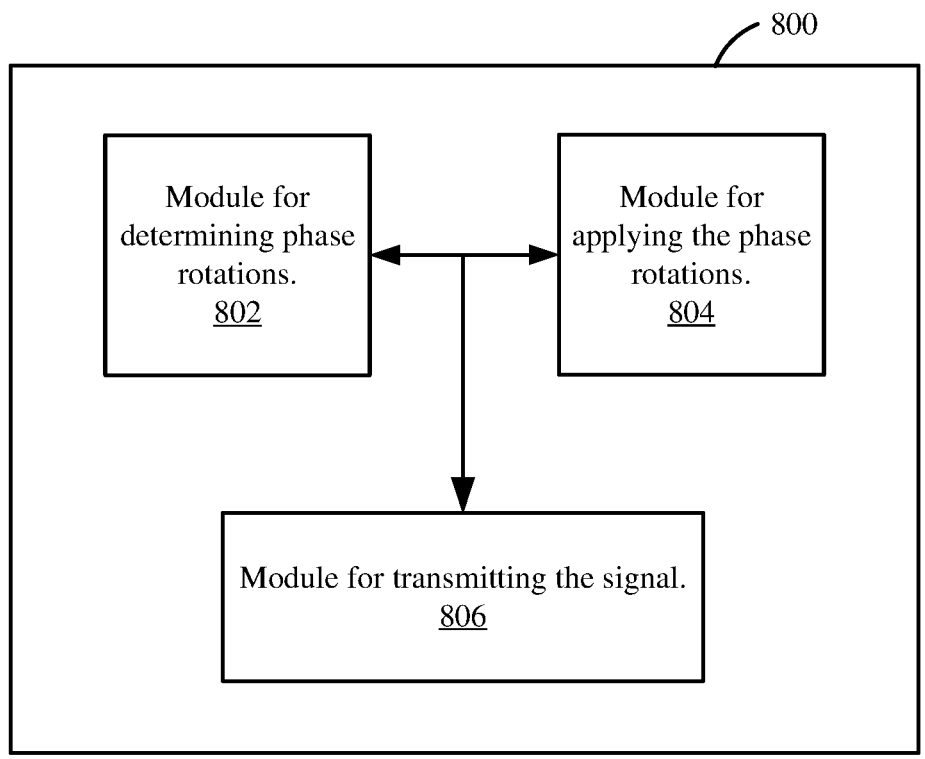
FIG. 8 shows a block diagram of an example wireless communication device according to some implementations.

FIG. 8 shows a block diagram of an example wireless communication device 800 according to some implementations. In some implementations, the wireless communication device 800 is configured to perform one or more of the processes 600 and 700 described above with reference to FIGS. 6 and 7, respectively. The wireless communication device 800 may be an example implementation of the wireless communication device 300 described above with reference to FIG. 3. For example, the wireless communication device 800 can be a chip, SoC, chipset, package or device that includes at least one processor and at least one modem (for example, a Wi-Fi (IEEE 802.11) modem or a cellular modem). In some implementations, the wireless communication device 800 can be a device for use in an AP, such as one of the APs 102 and 402 described above with reference to FIGS. 1 and 4A, respectively. In some other implementations, the wireless communication device 800 can be an AP that includes such a chip, SoC, chipset, package or device as well as at least one transmitter, at least one receiver, and at least one antenna.

The wireless communication device 800 includes a module for determining phase rotations 802, a module for applying the determined phase rotations to respective tones of a signal 804, and a module for transmitting the signal 806. Portions of one or more of the modules 802, 804, and 806 may be implemented at least in part in hardware or firmware. For example, the module for transmitting the signal 806 may be implemented at least in part by a modem (such as the modem 302). In some implementations, at least some of the modules 802, 804, and 806 are implemented at least in part as software stored in a memory (such as the memory 308). For example, portions of one or more of the modules 802, 804, and 806 can be implemented as non-transitory instructions (or "code") executable by a processor (such as the processor 306) to perform the functions or operations of the respective module.

The module for determining phase rotations 802 is configured to determine, for each tone of a plurality of tones of a signal for transmission, a phase rotation based on a carrier index range associated with the respective tone and a bandwidth mode for transmission of the signal.

The module for applying the determined phase rotations 804 is configured to apply the determined phase rotations to the respective tones of the plurality of tones.

The module for transmitting the signal 806 is configured to transmit the signal based on the application of the phase rotations to the plurality of tones of the signal.

Figure 9:
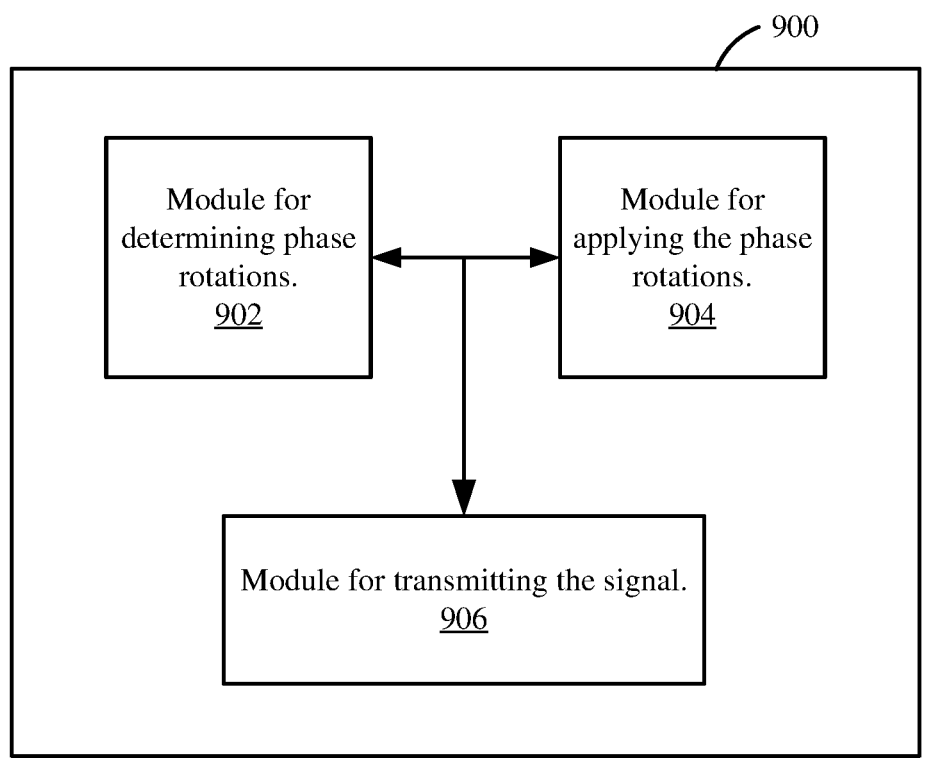
FIG. 9 shows a block diagram of an example wireless communication device according to some implementations.

FIG. 9 shows a block diagram of an example wireless communication device 900 according to some implementations. In some implementations, the wireless communication device 900 is configured to perform one or more of the processes 600 and 700 described above with reference to FIGS. 6 and 7, respectively. The wireless communication device 900 may be an example implementation of the wireless communication device 300 described above with reference to FIG. 3. For example, the wireless communication device 900 can be a chip, SoC, chipset, package or device that includes at least one processor and at least one modem (for example, a Wi-Fi (IEEE 802.11) modem or a cellular modem). In some implementations, the wireless communication device 900 can be a device for use in a STA, such as one of the STAs 104 and 404 described above with reference to FIGS. 1 and 4B, respectively. In some other implementations, the wireless communication device 900 can be a STA that includes such a chip, SoC, chipset, package or device as well as at least one transmitter, at least one receiver, and at least one antenna.

The wireless communication device 900 includes a module for determining phase rotations 902, a module for applying the determined phase rotations to respective tones of a signal 904, and a module for transmitting the signal 906. Portions of one or more of the modules 902, 904, and 906 may be implemented at least in part in hardware or firmware. For example, the module for transmitting the signal 906 may be implemented at least in part by a modem (such as the modem 302). In some implementations, at least some of the modules 902, 904, and 906 are implemented at least in part as software stored in a memory (such as the memory 308). For example, portions of one or more of the modules 902, 904, and 906 can be implemented as non-transitory instructions (or "code") executable by a processor (such as the processor 306) to perform the functions or operations of the respective module.

The module for determining phase rotations 902 is configured to determine, for each tone of a plurality of tones of a signal for transmission, a phase rotation based on a carrier index range associated with the respective tone and a bandwidth mode for transmission of the signal.

The module for applying the determined phase rotations 904 is configured to apply the determined phase rotations to the respective tones of the plurality of tones.

The module for transmitting the signal 906 is configured to transmit the signal based on the application of the phase rotations to the plurality of tones of the signal.

As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c.

The various illustrative components, logic, logical blocks, modules, circuits, operations and algorithm processes described in connection with the implementations disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A method for wireless communication performed by a wireless communication device, comprising:
   determining, for each tone of a plurality of tones of a signal for transmission, a phase rotation based on a carrier index range associated with said each tone and a bandwidth mode for transmission of the signal;
   applying the determined phase rotations to respective tones of the plurality of tones; and
   transmitting the signal based on the application of the phase rotations to the plurality of tones of the signal, wherein the bandwidth mode is a contiguous 160 MHz mode, wherein the determination of the phase rotations based on the carrier index ranges is according to:

$$\gamma_{k,160} = \begin{cases} 1, & k < -192 \\ -1, & -192 \leq k < 0 \\ 1, & 0 \leq k < 64 \\ -1, & 64 \leq k \end{cases},$$

and wherein k comprises a carrier index value and $\gamma_{k,160}$ represents the $k^{th}$ phase rotation of the phase rotations.

2. The method of claim 1, wherein the method further comprises applying a selected multiplier value of a plurality of multiplier values to each tone of the plurality of tones that falls within the carrier index range, and wherein said each tone of the plurality of tones that falls within the carrier index range is pre-extremely high throughput (pre-EHT) modulated.

3. The method of claim 2, wherein the carrier index range comprises an upper 80 MHz of the bandwidth mode.

4. The method of claim 1, wherein the phase rotations are determined without considering preamble puncturing for the transmitted signal.

5. The method of claim 1, wherein determination of the phase rotations is based on one or more front end bandwidths used to transmit the signal.

6. The method of claim 1, wherein the phase rotations are determined without considering front end bandwidths used to transmit the signal.

7. A method for wireless communication performed by a wireless communication device, comprising:
   determining, for each tone of a plurality of tones of a signal for transmission, a phase rotation based on a carrier index range associated with said each tone and a bandwidth mode for transmission of the signal;
   applying the determined phase rotations to respective tones of the plurality of tones; and
   transmitting the signal based on the application of the phase rotations to the plurality of tones of the signal, wherein the bandwidth mode is a 320 MHz mode, wherein the determination of the phase rotations based on the carrier index ranges is according to:

$$\gamma_{k,320} = \begin{cases} 1, & k < -448 \\ -1, & -448 \leq k < -256 \\ \rho_{1,320}, & -256 \leq k < -192 \\ -\rho_{1,320}, & -192 \leq k < 0 \\ \rho_{2,320}, & 0 \leq k < 64 \\ -\rho_{2,320}, & 64 \leq k < 256 \\ \rho_{3,320}, & 256 \leq k < 320 \\ -\rho_{3,320}, & 320 \leq k \end{cases},$$

and wherein ρ comprises a multiplier value to be applied to each tone of the plurality of tones that falls within the corresponding range of carrier indices, k comprises a carrier index value, and $\gamma_{k,320}$ represents the $k^{th}$ phase rotation of the phase rotations.

8. The method of claim 7, wherein $\rho_{0,320}=1$, and wherein $|\rho_{1,320}|=|\rho_{2,320}|=|\rho_{3,320}|=1$.

9. The method of claim 7, further comprising applying a selected multiplier value of a plurality of multiplier values to each tone of the plurality of tones that falls within the carrier index range, and wherein said each tone of the plurality of tones that falls within the carrier index range is pre-extremely high throughput (pre-EHT) modulated.

10. The method of claim 7, wherein the phase rotations are determined without considering preamble puncturing for the transmitted signal.

11. The method of claim 7, wherein determination of the phase rotations is based on one or more front end bandwidths used to transmit the signal.

12. The method of claim 7, wherein the phase rotations are determined without considering front end bandwidths used to transmit the signal.

13. A wireless communication device comprising:
at least one modem;
at least one processor communicatively coupled with the at least one modem; and
at least one memory communicatively coupled with the at least one processor and storing processor-readable code that, when executed by the at least one processor in conjunction with the at least one modem, is configured to:
determine, for each tone of a plurality of tones of a signal for transmission, a phase rotation based on a carrier index range associated with said each tone and a bandwidth mode for transmission of the signal;
apply the determined phase rotations to respective tones of the plurality of tones; and
transmit the signal based on the application of the phase rotations to the plurality of tones of the signal, wherein the bandwidth mode is a contiguous 160 MHz mode, wherein the determination of the phase rotations based on the carrier index ranges is according to:

$$\gamma_{k,160} = \begin{cases} 1, & k < -192 \\ -1, & -192 \leq k < 0 \\ 1, & 0 \leq k < 64 \\ -1, & 64 \leq k \end{cases},$$

and wherein k comprises a carrier index value and $\gamma_{k,160}$ represents the $k^{th}$ phase rotation of the phase rotations.

14. The wireless communication device of claim 13, wherein execution of the processor-readable code further causes the wireless communication device to apply a selected multiplier value of a plurality of multiplier values to each tone of the plurality of tones that falls within the carrier index range, and wherein said each tone of the plurality of tones that falls within the carrier index range is pre-extremely high throughput (pre-EHT) modulated.

15. The wireless communication device of claim 14, wherein the carrier index range comprises an upper 80 MHz of the bandwidth mode.

16. The wireless communication device of claim 13, wherein the phase rotations are determined without considering preamble puncturing for the transmitted signal.

17. The wireless communication device of claim 13, wherein determination of the phase rotations is based on one or more front end bandwidths used to transmit the signal.

18. The wireless communication device of claim 13, wherein the phase rotations are determined without considering front end bandwidths used to transmit the signal.

19. A wireless communication device comprising:
at least one modem;
at least one processor communicatively coupled with the at least one modem; and
at least one memory communicatively coupled with the at least one processor and storing processor-readable code that, when executed by the at least one processor in conjunction with the at least one modem, is configured to:
determine, for each tone of a plurality of tones of a signal for transmission, a phase rotation based on a carrier index range associated with said each tone and a bandwidth mode for transmission of the signal;
apply the determined phase rotations to respective tones of the plurality of tones; and
transmit the signal based on the application of the phase rotations to the plurality of tones of the signal, wherein the bandwidth mode is a 320 MHz mode, wherein the determination of the phase rotations based on the carrier index ranges is according to:

$$\gamma_{k,320} = \begin{cases} 1, & k < -448 \\ -1, & -448 \leq k < -256 \\ \rho_{1,320}, & -256 \leq k < -192 \\ -\rho_{1,320}, & -192 \leq k < 0 \\ \rho_{2,320}, & 0 \leq k < 64 \\ -\rho_{2,320}, & 64 \leq k < 256 \\ \rho_{3,320}, & 256 \leq k < 320 \\ -\rho_{3,320}, & 320 \leq k \end{cases},$$

and wherein ρ comprises a multiplier value to be applied to each tone of the plurality of tones that falls within the corresponding range of carrier indices, k comprises a carrier index value, and $\gamma_{k,320}$ represents the $k^{th}$ phase rotation of the phase rotations.

20. The wireless communication device of claim 19, wherein $\rho_{0,320}=1$, and wherein $|\rho_{1,320}|=|\rho_{2,320}|=|\rho_{3,320}|=1$.

21. The wireless communication device of claim 19, wherein execution of the processor-readable code further causes the wireless communication device to apply a selected multiplier value of a plurality of multiplier values to each tone of the plurality of tones that falls within the carrier index range, and wherein said each tone of the plurality of tones that falls within the carrier index range is pre-extremely high throughput (pre-EHT) modulated.

22. The wireless communication device of claim 19, wherein the phase rotations are determined without considering preamble puncturing for the transmitted signal.

23. The wireless communication device of claim 19, wherein determination of the phase rotations is based on one or more front end bandwidths used to transmit the signal.

24. The wireless communication device of claim 19, wherein the phase rotations are determined without considering front end bandwidths used to transmit the signal.

* * * * *